United States Patent
Takami et al.

(10) Patent No.: US 11,644,498 B2
(45) Date of Patent: May 9, 2023

(54) PARTIAL DISCHARGE DETECTION APPARATUS AND PARTIAL DISCHARGE DETECTION METHOD

(71) Applicant: HITACHI, LTD., Tokyo (JP)

(72) Inventors: Kazuhisa Takami, Tokyo (JP); Shoji Yoshida, Tokyo (JP); Mitsuyasu Kido, Tokyo (JP); Tatsuya Maruyama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 29 days.

(21) Appl. No.: 17/290,284

(22) PCT Filed: Aug. 22, 2019

(86) PCT No.: PCT/JP2019/032828
§ 371 (c)(1),
(2) Date: Apr. 30, 2021

(87) PCT Pub. No.: WO2020/121600
PCT Pub. Date: Jun. 18, 2020

(65) Prior Publication Data
US 2021/0373065 A1    Dec. 2, 2021

(30) Foreign Application Priority Data
Dec. 12, 2018    (JP) .............................. JP2018-232934

(51) Int. Cl.
*G01R 31/12* (2020.01)
*G01R 31/52* (2020.01)
*G01R 31/14* (2006.01)

(52) U.S. Cl.
CPC ......... *G01R 31/1272* (2013.01); *G01R 31/14* (2013.01); *G01R 31/52* (2020.01)

(58) Field of Classification Search
CPC ..... G01R 31/1272; G01R 31/14; G01R 31/52
See application file for complete search history.

(56) References Cited

U.S. PATENT DOCUMENTS

| | | | |
|---|---|---|---|
| 7,112,968 B1 * | 9/2006 | Nishizawa | ......... G01R 31/1272 324/536 |
| 2002/0163344 A1 | 11/2002 | Rokunohe et al. | |

(Continued)

FOREIGN PATENT DOCUMENTS

| | | | | |
|---|---|---|---|---|
| CN | 105210088 A | * | 12/2015 | ............. G01R 31/02 |
| JP | 05-80112 A | | 4/1993 | |

(Continued)

OTHER PUBLICATIONS

International Search Report of PCT/JP2019/032828 dated Nov. 12, 2019.

(Continued)

*Primary Examiner* — Patrick Assouad
*Assistant Examiner* — Demetrius R Pretlow
(74) *Attorney, Agent, or Firm* — Mattingly & Malur, PC

(57) ABSTRACT

A partial discharge detection apparatus for detecting partial discharge in a power cable and recognizing an insulation deterioration state of the power cable. A low-speed AD converter converts an analog signal of an AC waveform flowing through a power cable into a digital signal. A high-speed AD converter converts an analog signal of a partial discharge current into a digital signal. The partial discharge is detected based on the maximum value or the sum of a current value obtained from the digital signal of the partial discharge current obtained by the conversion of the high-speed AD converter, for each phase of the AC waveform, which is obtained from the digital signal of the AC waveform flowing in the power cable. The digital signal is obtained by the conversion of the low-speed AD converter.

7 Claims, 15 Drawing Sheets

(56) References Cited

U.S. PATENT DOCUMENTS

| | | | |
|---|---|---|---|
| 2009/0177420 A1 | 7/2009 | Fournier et al. | |
| 2015/0054524 A1* | 2/2015 | Kobayashi | G01R 31/1227 324/551 |
| 2016/0209459 A1* | 7/2016 | Tozzi | G01R 31/14 |
| 2019/0285683 A1* | 9/2019 | Kim | G01R 31/52 |
| 2020/0166561 A1* | 5/2020 | Winkelmann | G01R 31/14 |
| 2021/0190839 A1* | 6/2021 | Lim | G01R 23/165 |

FOREIGN PATENT DOCUMENTS

| | | | | |
|---|---|---|---|---|
| JP | 05-256893 A | | 10/1993 | |
| JP | H07225253 A | * | 8/1995 | |
| JP | 09-96657 A | | 4/1997 | |
| JP | H0996657 A | * | 4/1997 | |
| JP | 2016148575 A | * | 8/2016 | G01B 11/16 |
| KR | 20130034398 A | * | 4/2013 | |
| KR | 1641515 B1 | * | 7/2016 | G01R 31/086 |
| KR | 101641515 B1 | * | 7/2016 | |
| KR | 20150003618 A | * | 7/2016 | |
| KR | 20160136719 A | * | 11/2016 | |
| WO | WO-2015190260 A1 | * | 12/2015 | G01R 31/12 |
| WO | WO-2017022032 A1 | * | 2/2017 | G01R 31/12 |

OTHER PUBLICATIONS

Extended European Search Report received in corresponding European Application No. 19895244.2 dated Sep. 6, 2022.
Koltunowicz, W. et al., "PD Monitoring of HV XLPE Cable Lines", Proceedings of the 16th International Symposium on High Voltage Engineering, 2009, pp. 1-6.

* cited by examiner

PARTIAL DISCHARGE DETECTION APPARATUS AND PARTIAL DISCHARGE DETECTION METHOD

TECHNICAL FIELD

The present invention relates to a partial discharge detection apparatus and a partial discharge detection method.

BACKGROUND ART

In order to observe signs of insulation deterioration of a power cable, it is common to measure the charge amount of partial discharge generated when a high voltage is applied to the insulation of the power cable. An intermediate connection box of the power cable has a ground wire connected to the insulation of the cable. A current transformer (CT) can measure a current flowing through the ground wire during partial discharge. Then, the current in partial discharge, which is measured by the current transformer, is converted into a digital value by analog-to-digital (AD) conversion, and the partial discharge current is evaluated in accordance with the phase of an AC waveform flowing through the cable.

For example, Patent Literature 1 discloses a technique of observing signs of insulation deterioration of a cable by measuring the charge amount of partial discharge generated when a high voltage is applied to an insulation of the cable.

CITATION LIST

Patent Literature

PTL 1: JP 9-96657 A

SUMMARY OF INVENTION

Technical Problem

Since the discharge pulse of partial discharge, which is measured by the current transformer, is an analog signal, it is necessary that an AD converter digitizes the analog signal. Since the partial discharge is observed with an analog waveform of high-frequency pulses generated at minute intervals, it is required to measure the discharge pulse of partial discharge in a wide frequency band. Further, the AD converter needs to operate to satisfy the sampling theorem.

However, ultra-high-speed sampling is required for the AD converter to digitize and measure an analog signal in a wide frequency band under a condition of satisfying the sampling theorem. An AD converter capable of ultra-high-speed sampling is very expensive, and digital data obtained by AD conversion is also output at an ultra-high speed. In this case, signal processing of digital data also requires an ultra-high speed. In addition, as a field programmable gate array (FPGA) that performs signal processing, a high-speed and expensive FPGA is used for support signal processing performed at an ultra-high speed. Therefore, hardware for measuring partial discharge pulses becomes expensive.

Thus, the inventor has examined the adoption of an AD converter that does not operate at an ultra-high speed under a condition of not satisfying the sampling theorem, as an AD converter that detects partial discharge pulses generated in a wide band. When an analog signal is AD-converted under the condition of not satisfying the sampling theorem, partial discharge pulses are observed with reflected noise in all Nyquist frequency bands of the first, second, third, . . . , and n-th Nyquist. If it is only necessary to check whether or not there is the partial discharge pulse, there is no problem even though the reflected noise is observed.

However, in the AD conversion performed under the condition of not satisfying the sampling theorem, the signal-to-noise ratio (SN ratio) is significantly decreased in frequency bands at the first, second, third, . . . , and n-th Nyquist boundaries. In a case where the frequency band of the partial discharge pulse is at the Nyquist boundary, the SN ratio is decreased, and thus it is not possible to observe the partial discharge pulse.

The present invention has been made in view of such circumstances, and an object of the present invention is to enable detection of a partial discharge pulse under a condition of not satisfying the sampling theorem even in a wide band.

Solution to Problem

The present invention is a partial discharge detection apparatus for detecting partial discharge in a power cable and recognizing an insulation deterioration state of the power cable. A partial discharge detection apparatus includes a first converter, a second converter, and a signal processing unit. The first converter converts an analog signal of an AC waveform flowing through a power cable into a digital signal. The second converter converts an analog signal of a partial discharge current into a digital signal. The analog signal is in a plurality of Nyquist frequency domains defined for each of two different types of sampling frequencies. The signal processing unit detects an occurrence of partial discharge based on the maximum value or the sum of a current value obtained from the digital signal of the partial discharge current, which is obtained by the conversion of the second converter, for each phase of the AC waveform, which is obtained from the digital signal of the AC waveform flowing in the power cable. The digital signal is obtained by the conversion of the first converter.

Advantageous Effects of Invention

According to the present invention, even though the frequency band of a partial discharge pulse overlaps a Nyquist boundary of an analog signal of a partial discharge current sampled at a certain sampling frequency, the partial discharge pulse is detected at a location different from a Nyquist boundary of an analog signal sampled at another sampling frequency.

Objects, configurations, and advantageous effects other than those described above will be clarified by the descriptions of the following embodiments.

DESCRIPTION OF EMBODIMENTS

Hereinafter, embodiments for embodying the present invention will be described with reference to the accompanying drawings. In the present specification and the drawings, components having substantially the same functions or configurations are designated by the same reference signs, and repetitive description will be omitted.

First Embodiment

<Configuration Example of Partial Discharge Detection System>

Firstly, a configuration example of a partial discharge detection system according to a first embodiment of the present invention will be described.

Figure 1:
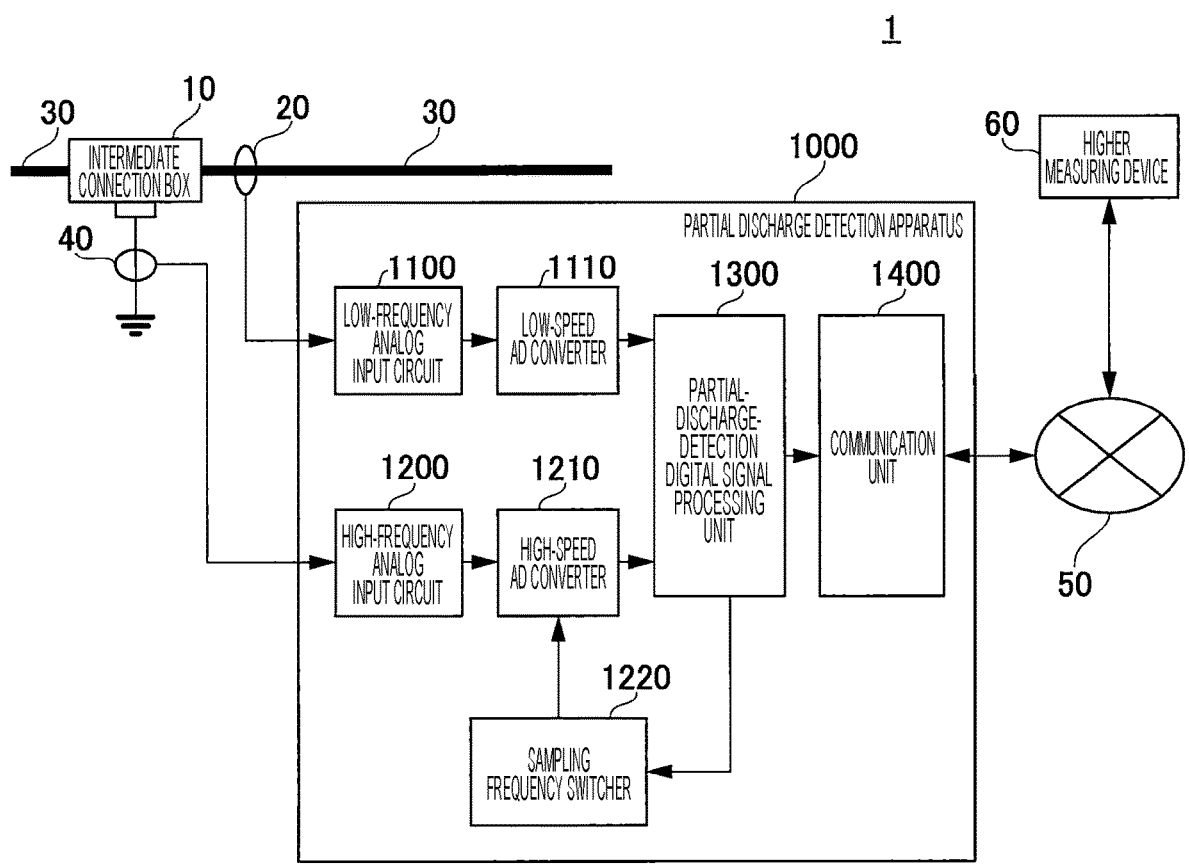
FIG. 1 is a schematic block diagram illustrating an example of a configuration of a partial discharge detection system 1 configured using a partial discharge detection apparatus according to a first embodiment of the present invention.

FIG. 1 is a schematic block diagram illustrating an example of a configuration of a partial discharge detection system 1 configured using a partial discharge detection apparatus 1000 according to the first embodiment of the present invention.

An intermediate connection box 10 is provided to connect power cables 30 to each other, and is grounded by a ground wire. A current transformer (for example, high-frequency CT) 40 that measures partial discharge is attached to the ground wire. Further, a Rogowski coil 20 for measuring an AC waveform is attached to the power cable 30.

The partial discharge detection apparatus 1000 is connected to the current transformer 40 and the Rogowski coil 20, respectively. Then, the partial discharge detection apparatus 1000 is capable of detecting the partial discharge in the power cable 30 and recognizing the insulation deterioration state of the power cable 30 by using a partial discharge detection method according to the present embodiment. The partial discharge detection apparatus 1000 is configured to transmit and receive data to and from a higher measuring device 60 via an external network 50.

As described above, the partial discharge detection system 1 is configured in a manner that the Rogowski coil 20, the current transformer 40, and the partial discharge detection apparatus 1000 are provided for the power cable 30 and the intermediate connection box 10, and the partial discharge detection apparatus 1000 and the higher measuring device 60 transmit and receive data to and from each other.

Analog signals (analog values) output from the current transformer 40 and the Rogowski coil 20 are input to the partial discharge detection apparatus 1000. Note that, a signal output from the current transformer 40 is a current signal flowing through the ground wire during partial discharge.

The partial discharge detection apparatus 1000 includes a low-frequency analog input circuit 1100, a low-speed AD converter 1110, a high-frequency analog input circuit 1200, a high-speed AD converter 1210, a partial-discharge-detection digital signal processing unit 1300, and a communication unit 1400.

An analog signal having an AC waveform of a commercial frequency, which is output from the Rogowski coil 20 is input to the low-frequency analog input circuit 1100. The partial-discharge-detection digital signal processing unit 1300 acquires voltage phase information from such a signal.

The low-speed AD converter 1110 corresponds to a first converter that converts an analog signal having an AC waveform flowing through the power cable 30 into a digital signal, and digitizes the analog signal having an AC waveform, which is input to the low-frequency analog input circuit 1100. The digital signal having an AC waveform, which is digitized by the low-speed AD converter 1110, is input to the partial-discharge-detection digital signal processing unit 1300.

An analog signal of a partial discharge current output from the current transformer 40 is input to the high-frequency analog input circuit 1200.

The high-speed AD converter 1210 corresponds to a second converter that converts an analog signal of a partial discharge current into a digital signal. Such an analog signal is in a plurality of Nyquist frequency domains defined for two different types of sampling frequencies. Therefore, the high-speed AD converter 1210 digitizes the analog signal of the partial discharge current input from the high-frequency analog input circuit 1200. The partial discharge digital signal obtained by digitization of the high-speed AD converter 1210 is input to the partial-discharge-detection digital signal processing unit 1300.

A sampling frequency switcher 1220 switches a sampling mode of the high-speed AD converter 1210 based on a switching signal input from the partial-discharge-detection digital signal processing unit 1300. The sampling mode includes, for example, a 180 MHz mode and a 200 MHz mode. Then, the sampling frequency switcher 1220 outputs a sampling clock of either 180 MHz or 200 MHz to the high-speed AD converter 1210 in accordance with a sampling mode signal.

Figure 6:
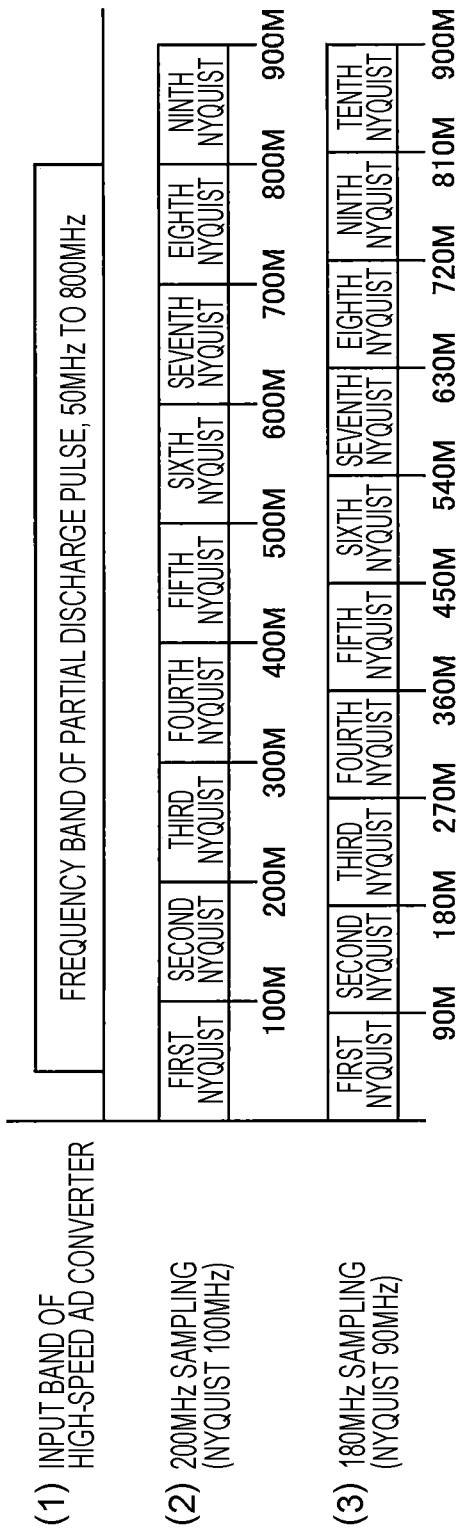
FIG. 6 is an explanatory diagram illustrating a frequency band in sampling at 200 MHz and 180 MHz in the high-speed AD converter according to the first embodiment of the present invention.

The high-speed AD converter 1210 switches a sampling frequency for each one cycle of the AC waveform in accordance with the sampling clock input from the sampling frequency switcher 1220, and samples and digitizes the analog signal of the partial discharge current at 180 MHz or 200 MHz. As described above, the high-speed AD converter 1210 uses a first sampling frequency (180 MHz) and a second sampling frequency (200 MHz), as two different types of sampling frequencies. Here, as illustrated in FIG. 6 described later, the value of the least common multiple (900 MHz) of a value being 1/2 of the first sampling frequency (90 MHz) and a value being 1/2 of the second sampling frequency (100 MHz) is set to a value larger than a frequency band of partial discharge (for example, 50 MHz to 800 MHz).

The partial-discharge-detection digital signal processing unit 1300 detects an occurrence of partial discharge based on the maximum value or the sum of a current value obtained from the digital signal of the partial discharge current, which is obtained by the conversion of the high-speed AD converter 1210, for each phase of the AC waveform obtained from the digital signal of the AC waveform flowing through the power cable 30, which is obtained by the conversion of the low-speed AD converter 1110. Therefore, the partial-discharge-detection digital signal processing unit 1300 obtains the phase of the AC waveform from the digital signal of the AC waveform, which is digitized by the low-speed AD converter 1110. Then, the digital signal of the partial discharge current, which is digitized by the high-speed AD converter 1210, is processed using the obtained phase information of the AC waveform.

Figure 4:
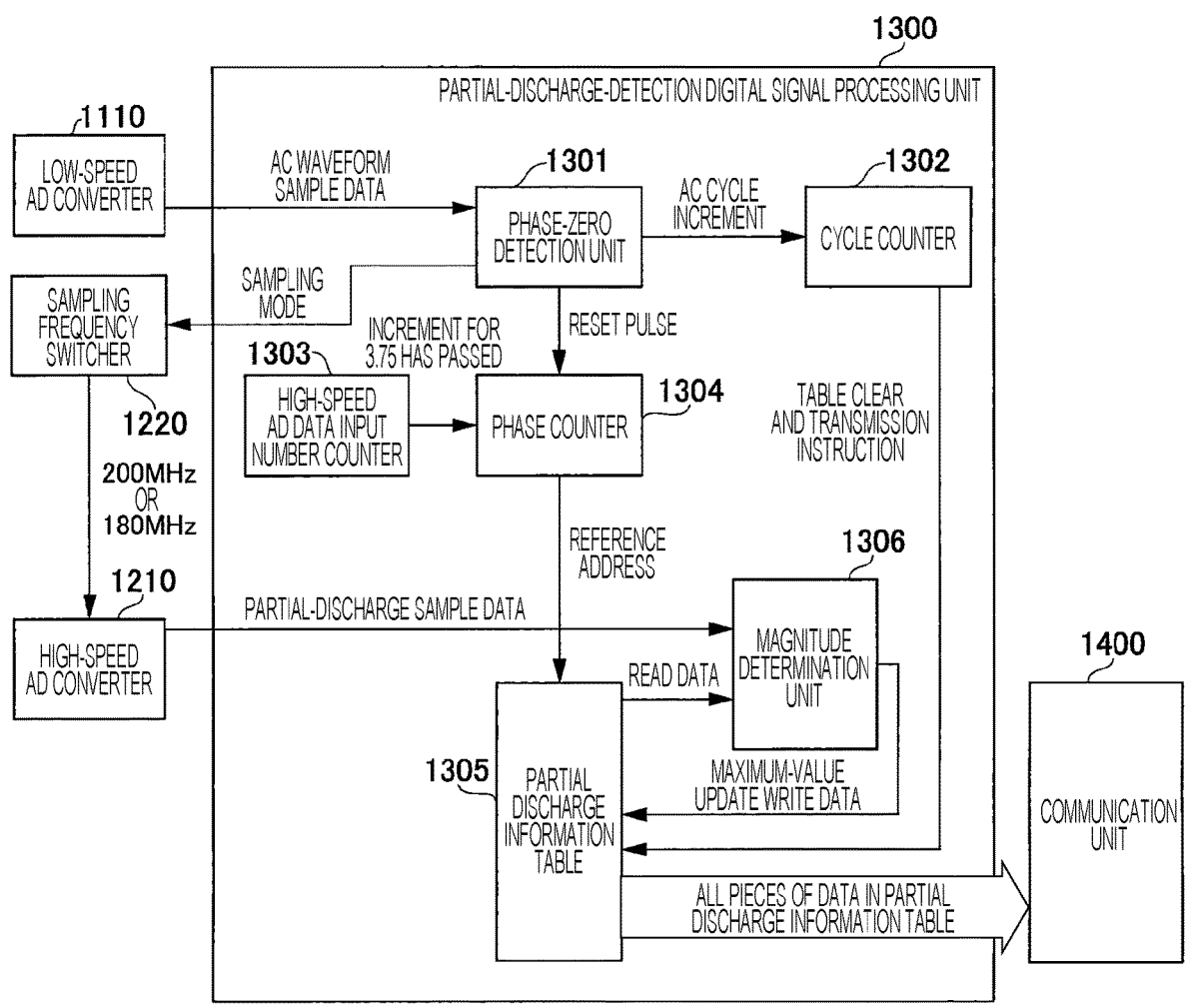
FIG. 4 is a block diagram illustrating a detailed configuration example of a partial-discharge-detection digital signal processing unit of the partial discharge detection apparatus according to the first embodiment of the present invention.

The communication unit 1400 outputs data (partial discharge detection result) recorded in a partial discharge information table 1305 illustrated in FIG. 4 to the higher measuring device 60 which is connected to the external network 50 and monitors the partial discharge. The data output to the higher measuring device 60 refers to all pieces of data recorded in the partial discharge information table 1305, and may refer to only some pieces of data.

Further, a plurality of partial discharge detection apparatuses 1000 are provided for all multiple power cables 30 connected by the intermediate connection box 10. The higher measuring device 60 collectively monitors detection results of the plurality of partial discharge detection apparatuses 1000 via the external network 50, and determines the sign of the insulation deterioration of the power cable 30.

In the partial discharge detection apparatus 1000, the high-speed AD converter 1210 performs analog-to-digital conversion by using a baseband sampling method and an under-sampling method together. Here, in the baseband sampling method, a first Nyquist frequency band (0 to 1/2·Fs (sampling frequency)) is set as an analog input band allowed to be digitized. The under-sampling method supports an analog input in a frequency band higher than the sampling frequency, and is a sampling method which is limited to a specific Nyquist frequency band that means a second, third, . . . , and n-th Nyquist frequency bands (n−1)/2 to n/2·Fs other than the first Nyquist frequency band. Then, the high-frequency analog input circuit 1200 can input a wideband analog signal to the high-speed AD converter 1210 by using the baseband sampling method and the under-sampling method together.

Next, a method of processing partial discharge data according to the first embodiment will be described with reference to FIGS. 2 and 3.

Figure 2:
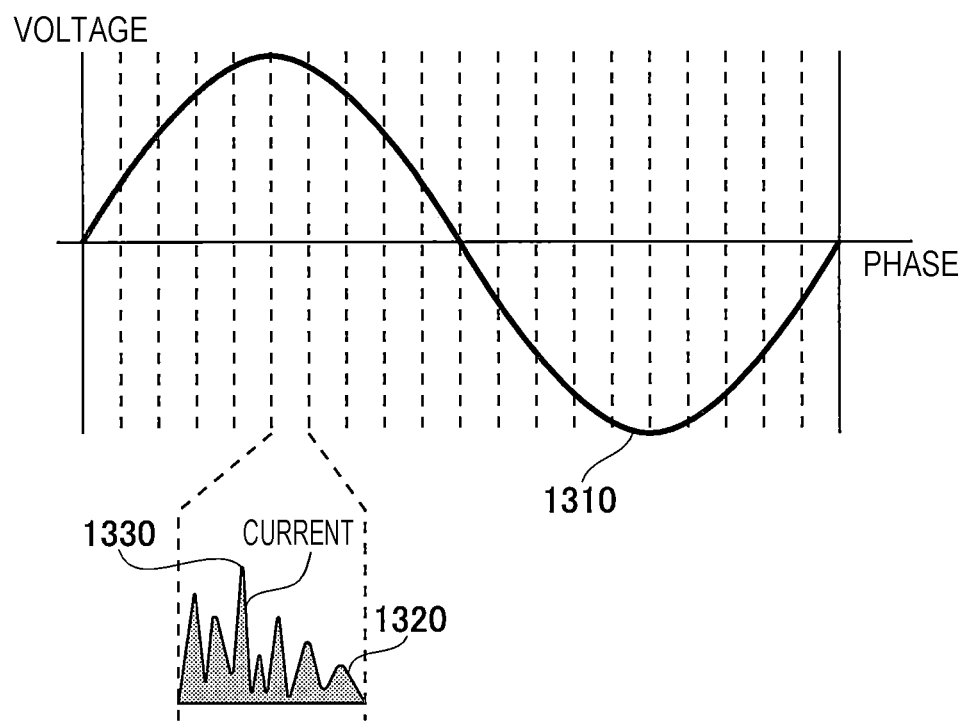
FIG. 2 is an enlarged view of a section division of a specific phase interval of an AC waveform of a measured current, which is used to process partial discharge data according to the first embodiment of the present invention, and one section.

FIG. 2 is an enlarged view illustrating an example of a section division of a specific phase interval of an AC waveform of a measured current, which is used to process partial discharge data, and one section. In the chart illustrated in FIG. 2, a horizontal axis indicates a phase, and a vertical axis indicates a voltage.

In one section defined by a specific phase interval of an AC waveform 1310, the partial-discharge-detection digital signal processing unit 1300 obtains the charge amount of the partial discharge in this section, from the digitized signal. As the charge amount, the sum of partial discharge pulse signals 1320 or the maximum value 1330 of the partial discharge pulse signal 1320 is obtained. Similarly, the partial-discharge-detection digital signal processing unit 1300 obtains the sum or the maximum value 1330 of the partial discharge pulse signal 1320, as the charge amount in each section in all sections of the specific phase interval.

The specific phase interval is obtained by dividing one cycle of 360° of an AC waveform of 50 Hz or 60 Hz by a predetermined number. For example, one section can be set to have a phase interval of 3.75° by dividing one cycle of 360° by 96 sections. Note that, in FIG. 2, for convenience of illustration, one cycle of the AC waveform is divided into 20 sections, but the number of sections is not limited to 20 sections in FIG. 2.

Further, a digital signal of the AC waveform, which is obtained by digitization of the low-speed AD converter 1110 from the analog signal of the AC waveform is used as the AC waveform 1310. Then, the phase of the AC waveform is obtained from the digital signal of the AC waveform, and the obtained phase of the AC waveform is used to divide the AC waveform into specific phase intervals as illustrated in FIG. 2.

As described above, the partial-discharge-detection digital signal processing unit 1300 obtains the sum or the maximum value of the partial discharge pulse signal 1320, as the charge amount of the partial discharge in all the sections of the specific phase intervals. Then, data of the obtained charge amount of the partial discharge is thinned out by signal processing of the partial-discharge-detection digital signal processing unit 1300.

Therefore, in the signal processing in the partial-discharge-detection digital signal processing unit 1300, only the maximum charge amount is extracted and recorded among the charge amounts (sums or maximum values of the amplitude of the partial discharge pulse signal 1320) of the partial discharge in all the sections of the specific phase intervals in a predetermined cycle of the AC waveform. Thus, pieces of digital data corresponding to a predetermined number of cycles in all the sections of the phase interval are thinned out to one piece of data indicating the maximum charge amount. The predetermined cycle of the AC waveform is selected from, for example, a range of 5 cycles to 20 cycles.

For example, in a case where the above-described one cycle of 360° is divided into 96 sections to obtain the charge amount and the predetermined cycle of the AC waveform is set to 10 cycles, pieces (96×10=960) of data of the charge amount of the partial discharge are recorded. Therefore, the partial-discharge-detection digital signal processing unit 1300 thins out other pieces of data so that only one piece of data indicating the maximum value of the charge amount of the partial discharge remains.

As described above, even though the pieces of digital data corresponding to the predetermined number of cycles in all sections of the phase interval are thinned to one maximum charge amount, the maximum charge amount after thinning changes depending on whether or not the partial discharge occurs. Thus, whether or not the partial discharge occurs is reflected in the maximum charge amount. Thus, it is possible to detect whether or not the partial discharge occurs, by the maximum charge amount.

As described above, the partial-discharge-detection digital signal processing unit 1300 thins out the pieces of data and transmits the remaining data (extracted data of the maximum charge amount) to the higher measuring device 60 from the communication unit 1400 via the external network 50.

The higher measuring device 60 monitors the transition of the data (data of the maximum charge amount) received from the external network 50. The higher measuring device 60 monitors the transition of the maximum charge amount, and thus it is possible to monitor the signs of the insulation deterioration of the power cable 30. In addition, it is possible to predict the lifespan of the existing power cable 30 by examining the deterioration state of the power cable 30.

Then, in the higher measuring device 60, if the currently-received data of the maximum charge amount of the partial discharge and the previously-received data of the maximum charge amount of the partial discharge are continuously compared with each other, it is possible to recognize the progress of deterioration of all multiple power cables 30 at any time.

Figure 3:
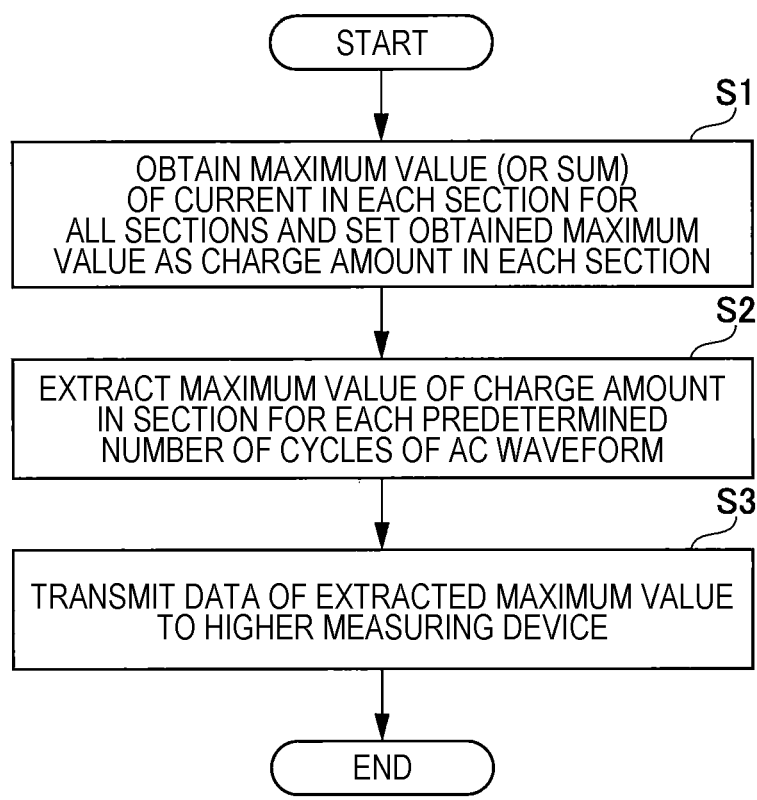
FIG. 3 is a flowchart illustrating a method of processing partial discharge data according to the first embodiment of the present invention.

The flowchart in FIG. 3 illustrates the method of processing the partial discharge data described above.

FIG. 3 is a flowchart illustrating an example of the method of processing the partial discharge data.

Firstly, the partial-discharge-detection digital signal processing unit 1300 obtains the maximum value or the sum of a current for each section of the AC waveform of a specific phase interval in all sections, and uses the obtained maximum value or sum as the charge amount in each section (S1).

Then, the partial-discharge-detection digital signal processing unit 1300 extracts the maximum value of the charge amount in the section for each predetermined number of cycles of the AC waveform (S2). Thus, pieces (number of sections in one cycle × number of cycles) of data are thinned out to one piece of data.

Then, the partial-discharge-detection digital signal processing unit 1300 transmits the data of the extracted maximum value of the charge amount to the higher measuring device 60 via the communication unit 1400 (S3).

In this manner, the data thinned out by the extraction is transmitted to the higher measuring device 60, and thus it is possible to reduce the amount of data transmitted to the higher measuring device 60.

The partial discharge detection apparatus 1000 is always installed on the power cable 30 and monitors the state of the power cable 30. Then, the partial discharge detection apparatus 1000 thins out the data to reduce the amount of data to be transmitted to the higher measuring device 60, and thus it is possible to reduce the cost or power consumption of the partial-discharge-detection digital signal processing unit 1300. This makes it possible to realize the constant installation of the partial discharge detection apparatus 1000.

Note that, the low-frequency analog input circuit 1100, the high-frequency analog input circuit 1200, the low-speed AD converter 1110, the high-speed AD converter 1210, and the partial-discharge-detection digital signal processing unit 1300 illustrated in FIG. 1 can be configured by either hardware or computer software.

In a case where each processing unit is configured by hardware, the processing unit is configured by an integrated circuit or the like provided in the partial discharge detection apparatus 1000.

In a case where each processing unit is configured by computer software, the processing unit is configured so that a processor such as a microcomputer can interpret and execute a program for realizing each function of the analog input circuit, the AD converter, and the partial-discharge-detection digital signal processing unit.

In addition, some processing units can be configured by hardware, and the remaining unit can be configured by computer software.

More preferably, the low-frequency analog input circuit 1100, the high-frequency analog input circuit 1200, the low-speed AD converter 1110, the high-speed AD converter 1210, and the partial-discharge-detection digital signal processing unit 1300 illustrated in FIG. 1 are configured by hardware.

In a case where the processing units are configured by computer software, a memory for storing calculation results and the like is required, and power for starting the software and operating the memory is also required.

On the other hand, in a case of being configured by hardware, the power for starting software and operating the memory is not required. Thus, it is possible to reduce the power required to operate the partial discharge detection apparatus 1000 in comparison to a case of being configured by computer software. This makes it possible to install more partial discharge detection apparatuses 1000 for all the multiple power cables 30.

Then, with the characteristics of a reflected-noise filter of the high-frequency analog input circuit 1200, it is possible to cause an analog signal in a plurality of Nyquist frequency domains as illustrated in FIG. 6 described later to pass. Then, in the high-speed AD converter 1210, the analog signal in the plurality of Nyquist frequency domains is converted into a digital signal. Thus, a wide band (for example, 50 MHz to 800 MHz) analog signal in a plurality of Nyquist frequency domains is converted into a digital signal, so that it is possible to detect the partial discharge occurring over a wide band.

Further, since the analog signal in the plurality of Nyquist frequency domains is converted, it is possible to reduce the sampling frequency in comparison to the baseband sampling method in which an analog signal in the first Nyquist frequency domain is converted. Thus, it is not necessary to use expensive components for the high-speed AD converter 1210 and the digital signal processing unit 1300, and it is possible to form the high-speed AD converter 1210 and the digital signal processing unit 1300 with relatively inexpensive components. Therefore, it is possible to realize a configuration for detecting the partial discharge by combining relatively inexpensive components.

In addition, the partial-discharge-detection digital signal processing unit 1300 divides one cycle of the AC waveform by a predetermined phase interval, and obtains the charge amount (maximum value or sum of the current value of the partial discharge) of the partial discharge for all sections of the predetermined phase interval. Thus, a signal of the charge amount (maximum value or sum of the current) of the partial discharge is obtained from all digital signals of the current of the partial discharge, which are obtained by conversion of the high-speed AD converter 1210, so that the amount of the signal is reduced.

Further, the partial-discharge-detection digital signal processing unit 1300 extracts the maximum value of the charge amount of the partial discharge for each predetermined number of cycles of the AC waveform in all the sections. Thus, signals of the charge amount, of which the number is (number of sections X predetermined number of cycles), are thinned out to one signal of the maximum charge amount, and thus the amount of the signal is reduced.

As described above, the partial-discharge-detection digital signal processing unit 1300 performs processing of reducing the amount of the signal of the partial discharge current, which is obtained by digital conversion of the high-speed AD converter 1210. Thus, even though the signal in a wide frequency domain of a plurality of Nyquist frequency domains is handled, the amount of the signal after processing is reduced. Since the amount of the signal is reduced, it is possible to realize, for example, simplification of the configuration (memory, and the like) for storing the signal, overflow prevention when data is transmitted from the communication unit 1400 to the external network 50, reduction of the power consumption of the partial discharge detection apparatus 1000, and the like.

In addition, the signal of the partial discharge is reduced in a manner that the phase of the AC waveform is obtained from the digital signal of the AC waveform, which is obtained by digital conversion of the low-speed AD converter 1110, and the obtained phase of the AC waveform is divided into sections of a predetermined phase interval. By using the phase of the AC waveform, it is possible to easily reduce the amount of the signal from the signal in a wide frequency range.

Further, since it is possible to prevent the overflow when the communication unit 1400 transmits data to the external network 50, the higher measuring device 60 can surely recognize the occurrence of the partial discharge in real time.

Since it is possible to reduce the power consumption of the partial discharge detection apparatus 1000, it is possible to install more partial discharge detection apparatuses 1000 for all the multiple power cables 30. Further, in contrast to the conventional detection method focusing on that the partial discharge detection apparatus is mainly moved to a location at which the measurement is desired, multiple partial discharge detection apparatuses 1000 are installed stationary. Thus, the higher measuring device 60 can always monitor the occurrence of the partial discharge.

Then, in the first embodiment, all digital signals of the partial discharge current, which are obtained by digital conversion of the high-speed AD converter 1210 are reduced to one signal of the maximum charge amount for each predetermined number of cycles of the AC waveform. Thus, the amount of the signal is significantly reduced. Accordingly, the effect of simplifying the configuration (memory, and the like) for storing the signal and reducing the power consumption of the partial discharge detection apparatus 1000 is increased, and it is possible to achieve the simplification of the configuration of the partial discharge detection apparatus 1000 or the reduction of the component cost.

Further, the partial discharge detection apparatus 1000 includes the communication unit 1400, and the communication unit 1400 is connected to the higher measuring device 60 via the external network 50 and is configured to transmit data from the communication unit 1400. Thus, in comparison to a case where the partial discharge detection apparatus 1000 and the higher measuring device 60 are connected to each other by wire, the degree of freedom in the installation of the partial discharge detection apparatus 1000 is increased, and it is possible to install more partial discharge detection apparatuses 1000 for all the multiple power cables 30.

<Configuration Example of Partial-discharge-detection Digital Signal Processing Unit>

FIG. 4 is a block diagram illustrating a detailed configuration example of the partial-discharge-detection digital signal processing unit 1300 of the partial discharge detection apparatus 1000.

The partial-discharge-detection digital signal processing unit 1300 includes a phase-zero detection unit 1301, a cycle counter 1302, a high-speed AD data input number counter 1303, a phase counter 1304, the partial discharge information table 1305, and a magnitude determination unit 1306.

The phase-zero detection unit 1301 detects the phase of 0 (phase of 0°) of the AC waveform from AC waveform sample data from the low-speed AD converter 1110. After the detection, a reset is output to the phase counter 1304, and the sampling frequency switcher 1220 switches the sampling mode signal.

The period counter 1302 counts the cycle of the AC waveform using the signal from the phase-zero detection unit 1301, and outputs the counted number of cycles to the partial discharge information table 1305. Further, the cycle counter 1302 outputs a transmission instruction to transmit all pieces of data in the partial discharge information table 1305 to the communication unit 1400 at a predetermined timing, and then issues an instruction to clear all the pieces of data in the partial discharge information table 1305. The timing at which the transmission instruction is output from the cycle counter 1302 is, for example, every 10 cycles of the AC waveform.

The high-speed AD data input number counter 1303 counts the number of times of sampling (number of times of data acquisition) of partial discharge data.

The phase counter 1304 resets the phase count of the AC waveform by the reset from the phase-zero detection unit 1301 output at a timing at which the phase of 0 of the AC waveform is detected. Then, the phase of the AC waveform is counted using the signal input from the high-speed AD data input number counter 1303.

In the partial discharge information table 1305, data of a digital signal obtained by conversion at the first sampling frequency (180 MHz) and data of a digital signal obtained by conversion at the second sampling frequency (200 MHz) are recorded for each predetermined phase interval obtained by dividing one cycle of the AC waveform. A detailed configuration example of the partial discharge information table 1305 will be described with reference to FIG. 8 described later.

The magnitude determination unit 1306 performs the magnitude determination by comparing data recorded in the partial discharge information table 1305 with the data of the digital signal obtained by conversion of the high-speed AD converter 1210 at the same phase interval. Then, the magnitude determination unit 1306 updates the data recorded in the partial discharge information table 1305 with the data of the digital signal obtained by the conversion of the high-speed AD converter 1210, which is determined to be larger than the data recorded in the partial discharge information table 1305.

For example, the magnitude determination unit 1306 determines the magnitudes of pieces of data by comparing sample data of the partial discharge from the high-speed AD converter 1210 with read data in the partial discharge information table 1305. Then, in a case where the sample data of the partial discharge is larger than the read data, the magnitude determination unit 1306 outputs write data (described as "maximum-value update write data" in FIG. 4) for writing the sample data of the partial discharge in the partial discharge information table 1305. The maximum value of the partial discharge information table 1305 is updated by the write data output from the magnitude determination unit 1306.

Note that, the units 1301 to 1306 of the partial-discharge-detection digital signal processing unit 1300 can be configured by either hardware or computer software.

In a case where the units 1301 to 1306 are configured by hardware, the units are configured by an integrated circuit or the like.

Further, in a case where the units 1301 to 1306 are configured by computer software, the units are configured so that a processor such as a microcomputer interprets and executes a program for realizing each function of the units 1301 to 1306.

In addition, some of the units 1301 to 1306 can be configured by hardware, and the remaining unit can be configured by computer software.

<Sampling Switching Timing>

Figure 5:
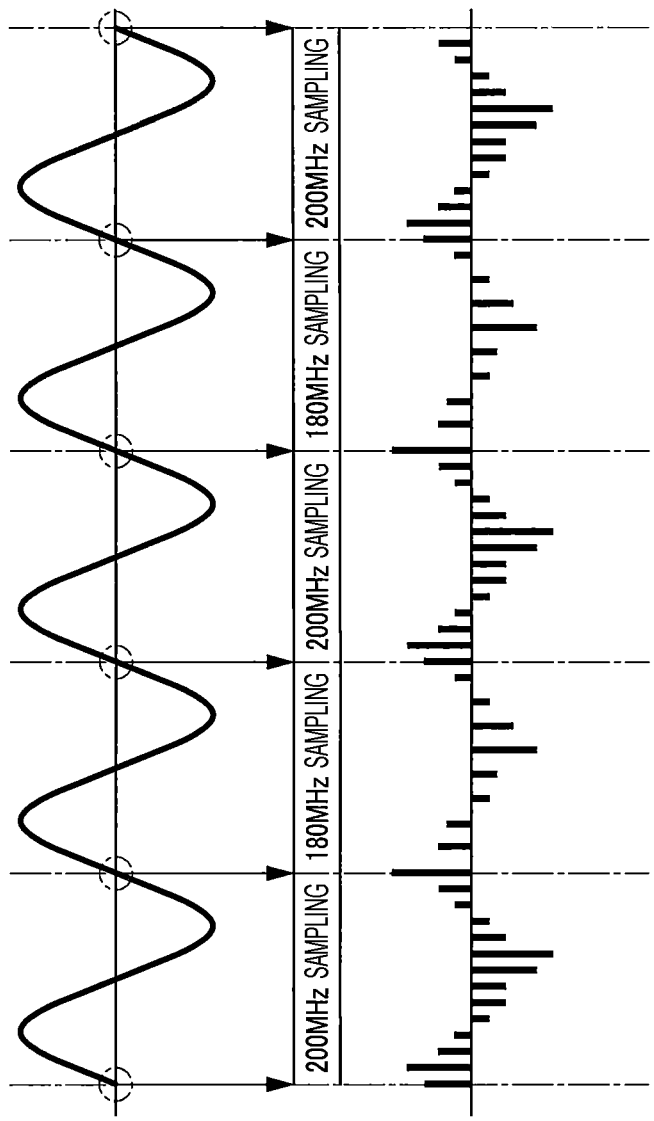
FIG. 5 is an explanatory diagram illustrating an example of a sampling switching timing of a high-speed AD converter according to the first embodiment of the present invention.

FIG. 5 is an explanatory diagram illustrating an example of a sampling switching timing of the high-speed AD converter 1210.

The waveform diagram (1) of FIG. 5 represents an example of an AC waveform having a commercial frequency. The commercial frequency is, for example, 50 Hz or 60 Hz. In the present embodiment, the description will be made on the assumption that the commercial frequency is 50 Hz.

The sampling switching timing (2) in FIG. 5 represents a timing at which the high-speed AD converter 1210 switches the sampling frequency. The sampling frequency of the high-speed AD converter 1210 is switched to either 180 MHz or 200 MHz for each one cycle of the AC waveform of the commercial frequency. As described above, the high-speed AD converter 1210 performs alternate switching between processing of converting an analog signal into a digital signal at the first sampling frequency (180 MHz) and processing of converting an analog signal into a digital signal at the second sampling frequency (200 MHz), for each predetermined cycles of the AC waveform.

The sampling data (3) in FIG. 5 represents sampling data of a partial discharge pulse of 180 MHz or 200 MHz, which is output from the high-speed AD converter 1210 for each one cycle of the AC waveform. The magnitude determination is performed to determine whether the sampling data of 180 MHz and 200 MHz is larger than the maximum value stored in the partial discharge information table 1305. Then, the data in the partial discharge information table 1305 is updated with the larger value.

All the pieces of data recorded in the partial discharge information table 1305 are transferred to the communication unit 1400 and then output to the external network 50 as the partial discharge detection result. Then, the higher measuring device 60 receives all the pieces of data of the partial discharge information table 1305 via the external network 50, and collectively monitors the partial discharge.

FIG. 6 is an explanatory diagram illustrating the frequency bands in 200 MHz and 180 MHz sampling in the high-speed AD converter 1210. The first to n-th Nyquist boundaries have a bandwidth interval of 1/2 of the sampling frequency. That is, the Nyquist boundary appears, for example, every 100 MHz in the case of 200 MHz sampling and every 90 MHz in the case of 180 MHz sampling.

As illustrated at the upper part of FIG. 6, the frequency band of the partial discharge pulse is considered to be in a range of 50 MHz to 800 MHz. Therefore, two types of sampling frequencies are set so that Nyquist boundaries do not overlap as wide as possible. Here, the sampling frequency is set under a condition that the value of the least common multiple of two types of sampling frequencies 1/2 (Nyquist boundary frequency) is larger than the frequency band of the partial discharge pulse.

For example, in a case where the partial discharge pulse is 200 MHz, it is possible to detect the partial discharge pulse under the 180 MHz sampling condition even though it is not possible to detect the partial discharge pulse under the 200 MHz sampling condition. On the contrary, in a case where the partial discharge pulse is 180 MHz, it is possible to detect the partial discharge pulse under the 200 MHz sampling condition even though it is not possible to detect the partial discharge pulse under the 180 MHz sampling condition.

From the above description, even with the high-speed AD converter 1210 that does not satisfy the sampling theorem, it is possible to reliably observe the partial discharge pulse.

<Phase Counting Processing of AC Waveform and Detection Processing of Partial Discharge>

Next, counting the phase of the AC waveform and detecting partial discharge in the method of processing the partial discharge data will be described with reference to FIGS. 7 and 8.

Figure 7:
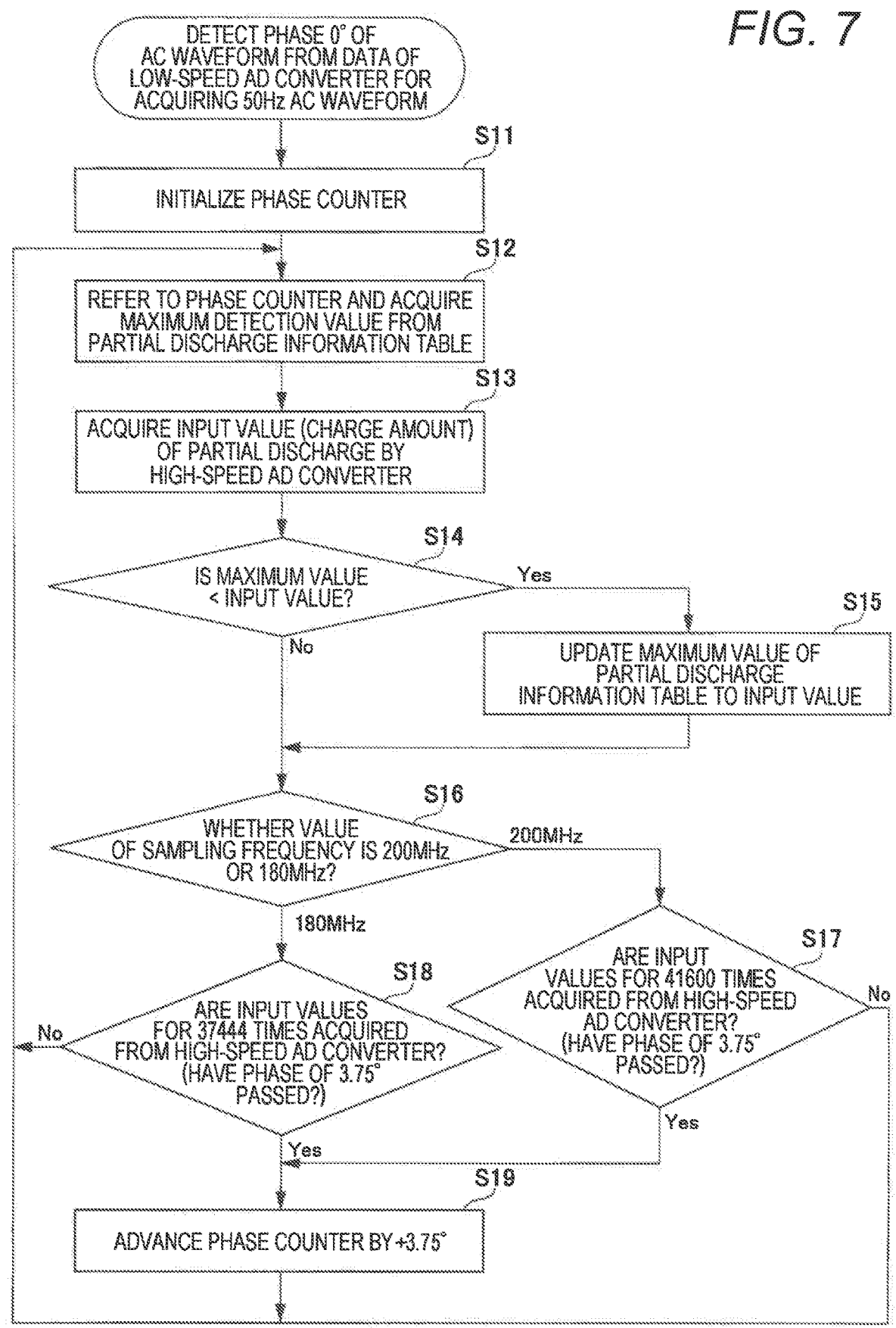
FIG. 7 is a flowchart illustrating an example of a phase count of an AC waveform and processing of detecting partial discharge, according to the first embodiment of the present invention.

FIG. 7 is a flowchart illustrating an example of the phase count of the AC waveform and the detection processing of the partial discharge.

Figure 8:
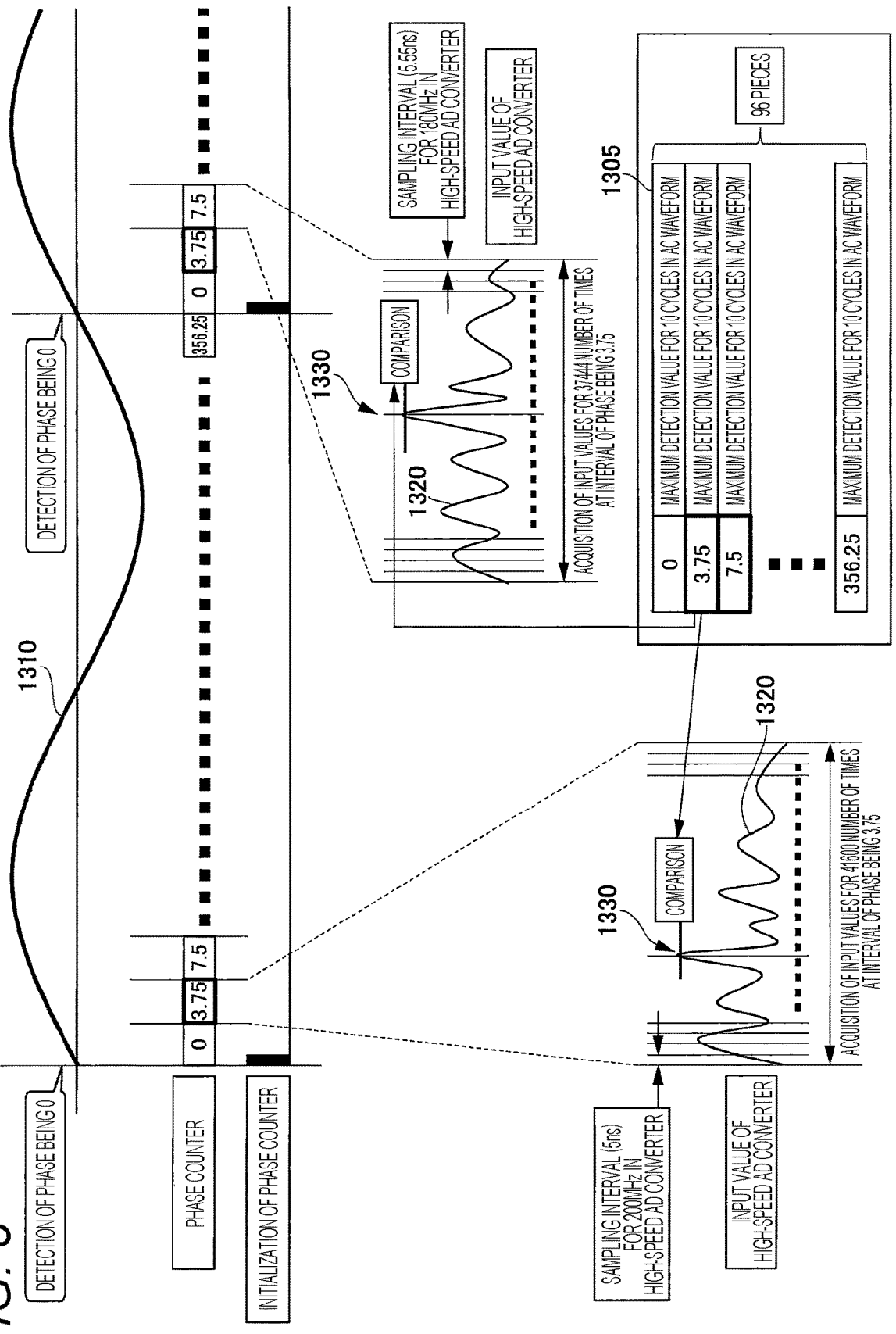
FIG. 8 is an explanatory diagram illustrating a form in which a magnitude determination unit detects the partial discharge in one cycle of the AC waveform, according to the first embodiment of the present invention.

FIG. 8 is an explanatory diagram illustrating a form in which the magnitude determination unit 1306 detects the partial discharge in one cycle of the AC waveform.

Firstly, as illustrated at the top of FIG. 7 (that is, at the start), the phase-zero detection unit 1301 detects the phase of 0° of the AC waveform based on AC waveform sample data input from the low-speed AD converter 1110 for acquiring a 50 Hz AC waveform.

At this time, as illustrated in FIG. 8, the AC waveform 1310 is the leftmost zero crossing point.

Then, when the phase-zero detection unit 1301 detects the phase 0°, the phase-zero detection unit 1301 outputs a reset pulse (initialization pulse) to the phase counter 1304 to initialize the phase counter 1304 (S11). At this time, as illustrated at the upper left of FIG. 8, the value of the phase counter 1304 is "0".

Then, the magnitude determination unit 1306 acquires the maximum detection value corresponding to the phase of the phase counter 1304, from the partial discharge information table 1305 that refers to the phase counter 1304 (S12). Here, the phase of the phase counter 1304 is transmitted to the partial discharge information table 1305 as a reference address. Then, the maximum detection value (read data) corresponding to the reference address is acquired from the partial discharge information table 1305 and transmitted to the magnitude determination unit 1306.

As illustrated at the lower right of FIG. 8, the partial discharge information table 1305 is configured by the phases of sections (96 sections) of each 3.75° phase and the maximum detection value (maximum value of the charge amount of the partial discharge for 10 cycles) of the section of the phase for 10 cycles of the AC waveform. Then, the magnitude determination unit 1306 uses the value of the phase (0, 3.75, 7.5, . . . , 356.25) of the phase counter 1304 as a reference address to acquire the maximum detection value (read data) of the section of the phase for 10 cycles of the AC waveform, from the partial discharge information table 1305.

Then, the magnitude determination unit 1306 acquires the input value (charge amount) of the partial discharge from the sample data of the partial discharge acquired by the high-speed AD converter 1210 (S13). The input value (charge amount) of the partial discharge is represented as the partial discharge pulse signal 1320 which is sampled at a sampling interval (5.55 ns) of 180 MHz of the high-speed AD converter 1210 or a sampling interval (5 ns) of 200 MHz of the high-speed AD converter 1210, as illustrated in FIG. 8.

Then, the magnitude determination unit 1306 compares the maximum detection value of the partial discharge acquired from the partial discharge information table 1305 with the input value (charge amount) of the partial discharge acquired from the high-speed AD converter 1210 (S14). In a case of the maximum value (maximum detection value in the partial discharge information table 1305)<input value (Yes in S14), the magnitude determination unit 1306 updates the maximum value (maximum detection value) of the partial discharge information table 1305 with the input value (S15). Then, the process proceed to Step S16.

In a case of the maximum value (maximum detection value in the partial discharge information table 1305)≥input value (No in S14), the partial discharge information table 1305 is not updated. Then, after No in S14 or the process of Step S15, the magnitude determination unit 1306 determines whether the sampling frequency value is 180 MHz or 200 MHz (S16).

In a case where the magnitude determination unit 1306 determines that the sampling frequency value is 200 MHz, the high-speed AD data input number counter 1303 checks whether the input value is acquired 41600 number of times from the high-speed AD converter 1210 (whether the phase 3.75° has passed), based on the elapsed time (S17).

Here, the number of input values=(elapsed time/sampling interval 5 ns), and the input value for 41600 number of times is about 208 μs. Therefore, every time 208 μs elapses, a signal may be output from the high-speed AD data input number counter 1303.

Then, in a case where the high-speed AD data input number counter 1303 acquires the input value 41600 number of times (Yes in S17), the process proceeds to Step S19. On the other hand, if the high-speed AD data input number counter 1303 has not acquired the input value 41600 times (No in S17), the process returns to Step S12 and continues processing.

On the other hand, in a case where the magnitude determination unit 1306 determines that the sampling frequency value is 180 MHz in Step S16, the high-speed AD data input number counter 1303 checks whether the input value is acquired 37444 number of times from the high-speed AD converter 1210 (whether the phase 3.75° has passed), based on the elapsed time (S18).

Here, the number of input values=(elapsed time/sampling interval 5.55 ns), and the input value for 37444 number of times is about 208 μs. Therefore, every time 208 μs elapses, a signal may be output from the high-speed AD data input number counter 1303.

Then, in a case where the high-speed AD data input number counter 1303 acquires the input value 37444 number of times (Yes in S18), the process proceeds to Step S19. On the other hand, in a case where the high-speed AD data input number counter 1303 does not acquire the input value 37444 number of times (No in S18), the process returns to Step S12 and continues the processing.

As described above, the steps of Steps S12 to S18 are repeated until the high-speed AD data input number counter 1303 acquires the input value 37444 number of times if the sampling frequency value is 180 MHz, and acquires the input value 41600 number of times if the sampling frequency value is 200 MHz. Thus, the maximum value 1330 of the input values (charge amount) of the partial discharge pulse signal 1320 illustrated in FIG. 8 is compared with the maximum detected value in the partial discharge information table 1305. Then, if the maximum value 1330 of the input value is larger, the maximum detection value of the partial discharge information table 1305 is updated to the maximum value 1330 of the input value.

After Yes in Step S17 or Yes in Step S18, the phase counter 1304 is advanced by +3.75° (S19), and the process proceeds to Step S12. At this time, a signal of a 3.75° elapsed increment is output from the high-speed AD data input number counter 1303 to the phase counter 1304.

At this time, in FIG. 8, the phase counter 1304 shifts to the next phase section. For example, the phase shifts from the phase 3.75 section to the phase 7.5 section.

Then, for the next phase section, the input value of the partial discharge is acquired and the input value is compared with the maximum detection value in the partial discharge information table 1305. In this manner, by counting the phase of the AC waveform and detecting the partial discharge, the input value (charge amount) of the partial discharge is detected for each section of the predetermined phase interval of the AC waveform, and the maximum value of the charge amount of the partial discharge for each section is extracted.

Further, in the next cycle of the AC waveform 1310, the phase-zero detection unit 1301 transmits an instruction to switch the sampling mode to the sampling frequency switcher 1220. Then, the sampling mode of the high-speed AD converter 1210 is switched to a sampling mode different from the sampling mode set in the previous cycle of the AC waveform 1310. For example, if the 180 MHz mode is set in the previous cycle, the 200 MHz sampling mode is set in the next cycle. On the contrary, if the 200 MHz sampling mode is set in the previous cycle, the 180 MHz sampling mode of is set in the next cycle. Then, the processing illustrated in FIG. 7 is performed by the switched sampling mode.

<Clear of Partial Discharge Information Table and Processing of Transmitting Partial Discharge Information to Communication Unit>

Next, clearing the partial discharge information table 1305 and transmitting the partial discharge information to the communication unit 1400 in the method of processing the partial discharge data will be described with reference to FIGS. 4, 9, and 10.

Figure 9:
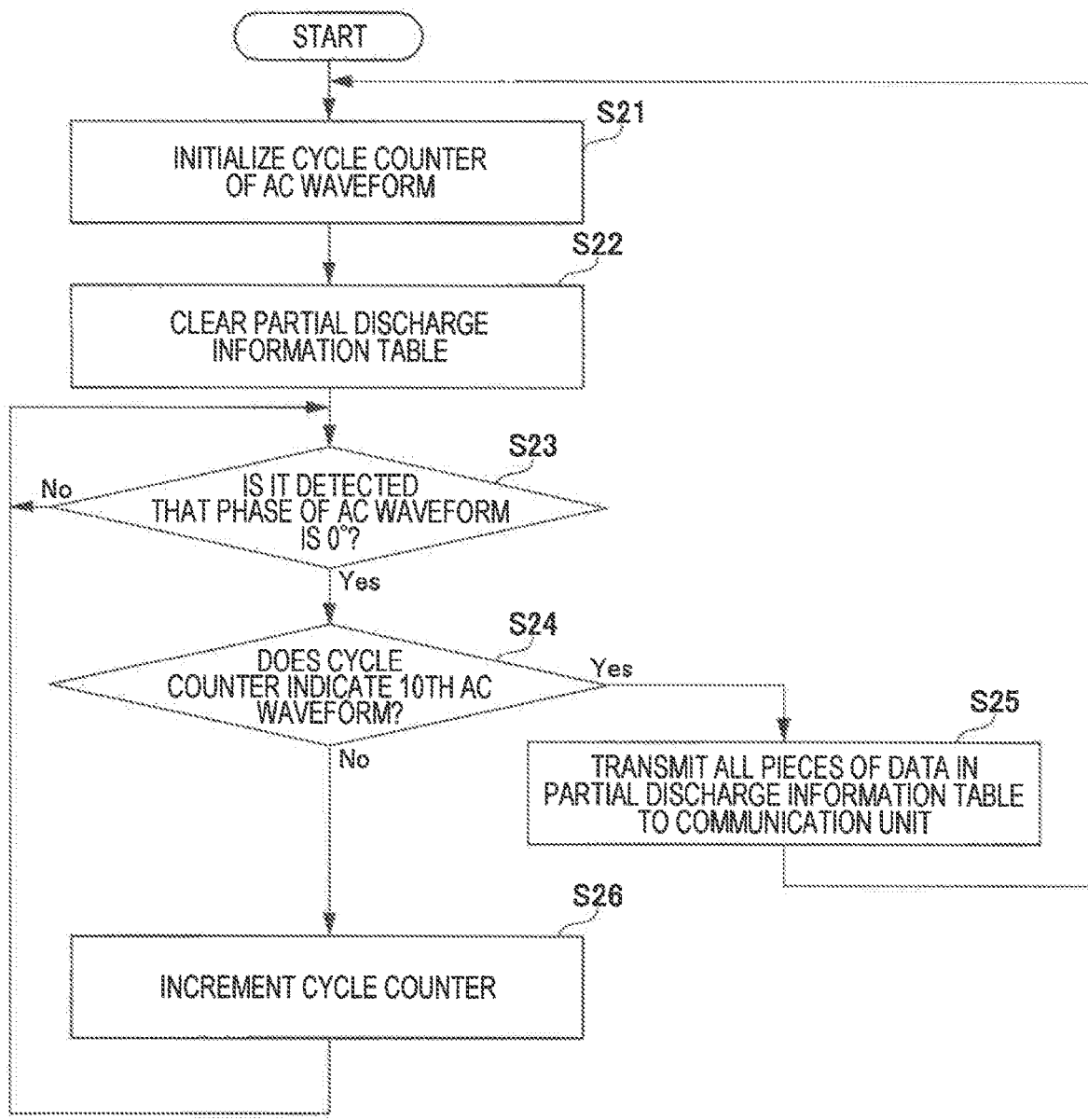
FIG. 9 is a flowchart illustrating an example of a clear of a partial discharge information table and processing of transmitting the partial discharge information to a communication unit, according to the first embodiment of the present invention.

FIG. 9 is a flowchart illustrating an example of processing of clearing the partial discharge information table 1305 and processing of transmitting the partial discharge information to the communication unit 1400.

Figure 10:
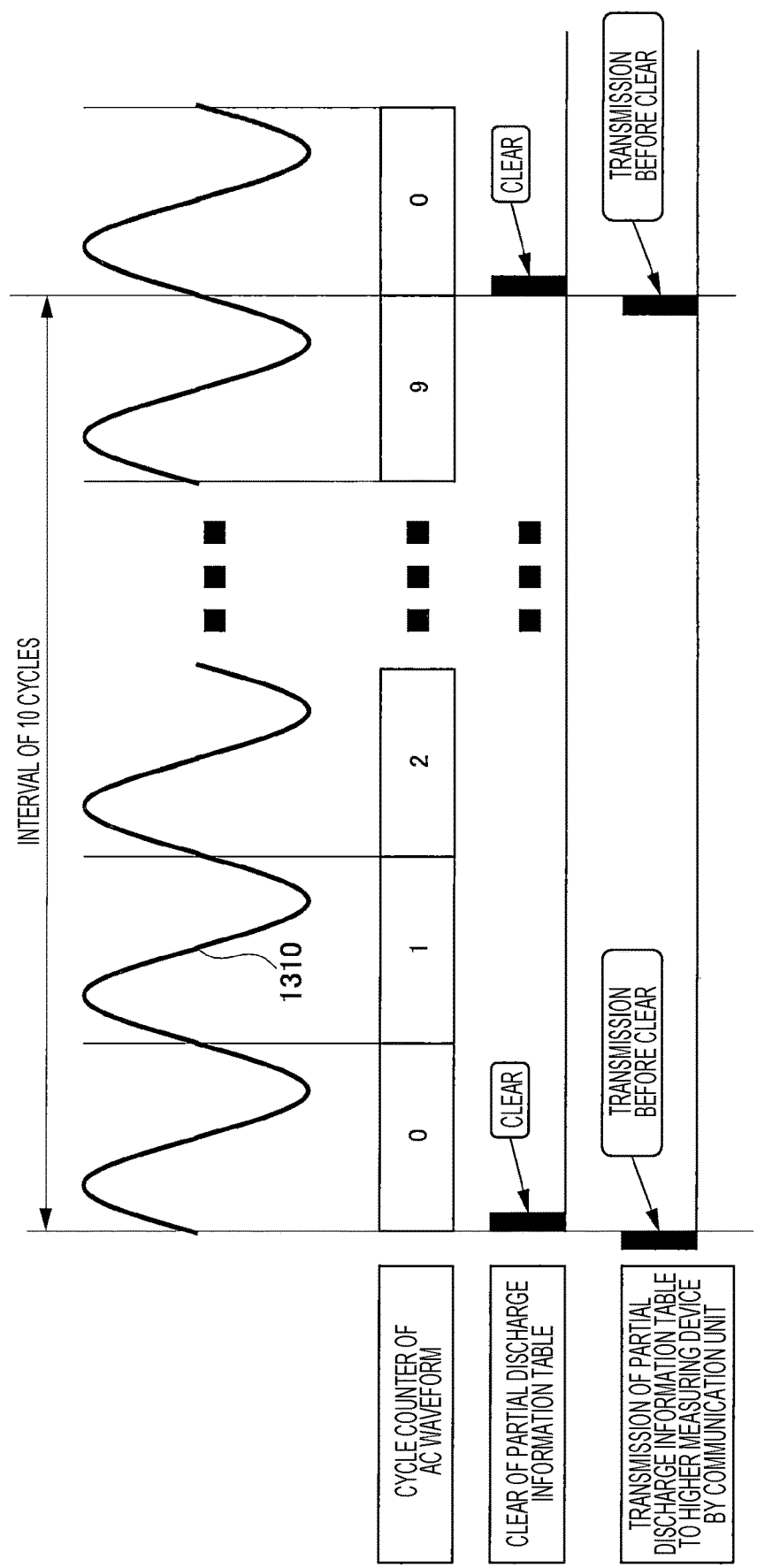
FIG. 10 is an explanatory diagram illustrating an example of a timing at which the partial discharge information table is cleared, and a timing at which partial discharge information is transmitted, according to the first embodiment of the present invention.

FIG. 10 is an explanatory diagram illustrating an example of a timing at which the partial discharge information table 1305 is cleared, and a timing at which partial discharge information is transmitted.

Firstly, the cycle counter 1302 of the AC waveform is initialized (S21). At this time, the cycle counter 1302 is initialized to the value "0" as illustrated in FIG. 10.

Then, the partial discharge information table 1305 is cleared (S22). At this time, a table clear signal is transmitted from the cycle counter 1302 to the partial discharge information table 1305. Then, as illustrated in FIG. 10, the partial discharge information table 1305 to which the table clear signal is input is cleared.

Then, the phase-zero detection unit 1301 checks whether or not the phase 0° of the AC waveform is detected (S23). The Step S23 represents the same processing as the detection of the phase 0° described at the top (starting point) of the flowchart of FIG. 7. In a case where the phase-zero detection unit 1301 detects the phase 0° (Yes in S23), the process proceeds to Step S24. In a case where the phase 0° is not detected (No in S23), the process returns to Step S23.

Then, in a case of Yes in Step S23, the cycle counter 1302 checks whether the AC waveform is in the 10th cycle (S24). In a case where the AC waveform is in the 10th cycle (Yes in S24), the process proceeds to Step S25. In a case where the AC waveform is not in the 10th cycle (No in S24), the process proceeds to Step S26.

In a case where the cycle counter 1302 determines that the AC waveform is in the 10th cycle (Yes in S24), all the pieces of data in the partial discharge information table 1305 are transmitted from the partial discharge information table 1305 to the communication unit 1400 (S25). Then, the phase-zero detection unit 1301 initializes the cycle counter 1302.

At this time, in FIG. 10, the value of the cycle counter 1302 is "9", which corresponds to the 10th cycle. Then, the cycle counter 1302 is initialized, and thus the value of the cycle counter 1302 returns to "0", which corresponds to the first cycle.

Further, before the cycle counter 1302 is initialized and the partial discharge information table 1305 is cleared, all the pieces of data in the partial discharge information table 1305, which are transmitted to the communication unit 1400 are transmitted from the communication unit 1400 to the higher measuring device 60. Then, when the cycle counter 1302 is initialized, the partial discharge information table 1305 is also cleared.

In a case where the cycle counter 1302 determines that the AC waveform is not in the 10th cycle (No in S24), the AC cycle increment signal from the phase-zero detection unit 1301 is input to the cycle counter 1302, and the cycle counter 1302 increments (S26). At this time, as illustrated in FIG. 10, the value of the cycle counter 1302 increases by 1 from 0 to 1, 1 to 2, 2 to 3, and shifts to the next cycle of the AC waveform.

As described above, the steps of Steps S23 to S26 are repeated until the AC waveform has passed 10 cycles. Thus, the cycle of the AC waveform is measured starting from the phase 0° of the AC waveform, and all the pieces of data are transmitted from the partial discharge information table 1305 to the communication unit 1400 every 10 cycles of the AC waveform. Then, after the cycle counter 1302 is initialized and the partial discharge information table 1305 is cleared, the process proceeds to processing in the next 10 cycles.

<Monitoring Transition of Data in Higher Measuring Device>

Next, monitoring of data transition in the higher measuring device 60 will be described.

The higher measuring device 60 performs comparison of the data in the partial discharge information table 1305, which is received from the communication unit 1400 of the partial discharge detection apparatus 1000 with reference to the partial discharge information table 1305, which has been previously received. Then, the data in the current partial discharge information table 1305 received from the communication unit 1400 is compared with the data in the partial discharge information table 1305, which is used as the reference and has been previously received. In a case where it is determined that the increase of the maximum detection value of the partial discharge is large, the higher measuring device transmits an alarm that there is a sign of the insulation deterioration in the power cable 30.

Note that, the reception time of the partial discharge information table 1305 previously received from the partial discharge detection apparatus 1000, which is referred to by the higher measuring device 60, can be preferable to be freely selected, for example, 1 day ago, 1 month ago, 1 year ago, and the like depending on the setting of a user.

Further, as a criterion for determining that the increase of the maximum detection value of the partial discharge is large, a predetermined criterion may be selected, for example, the maximum detection value is doubled or more.

<Method of Determining Whether or not Insulation of Power Cable is Deteriorated>

Next, a method for determining the presence or absence of insulation deterioration of the power cable will be described.

Figure 11:
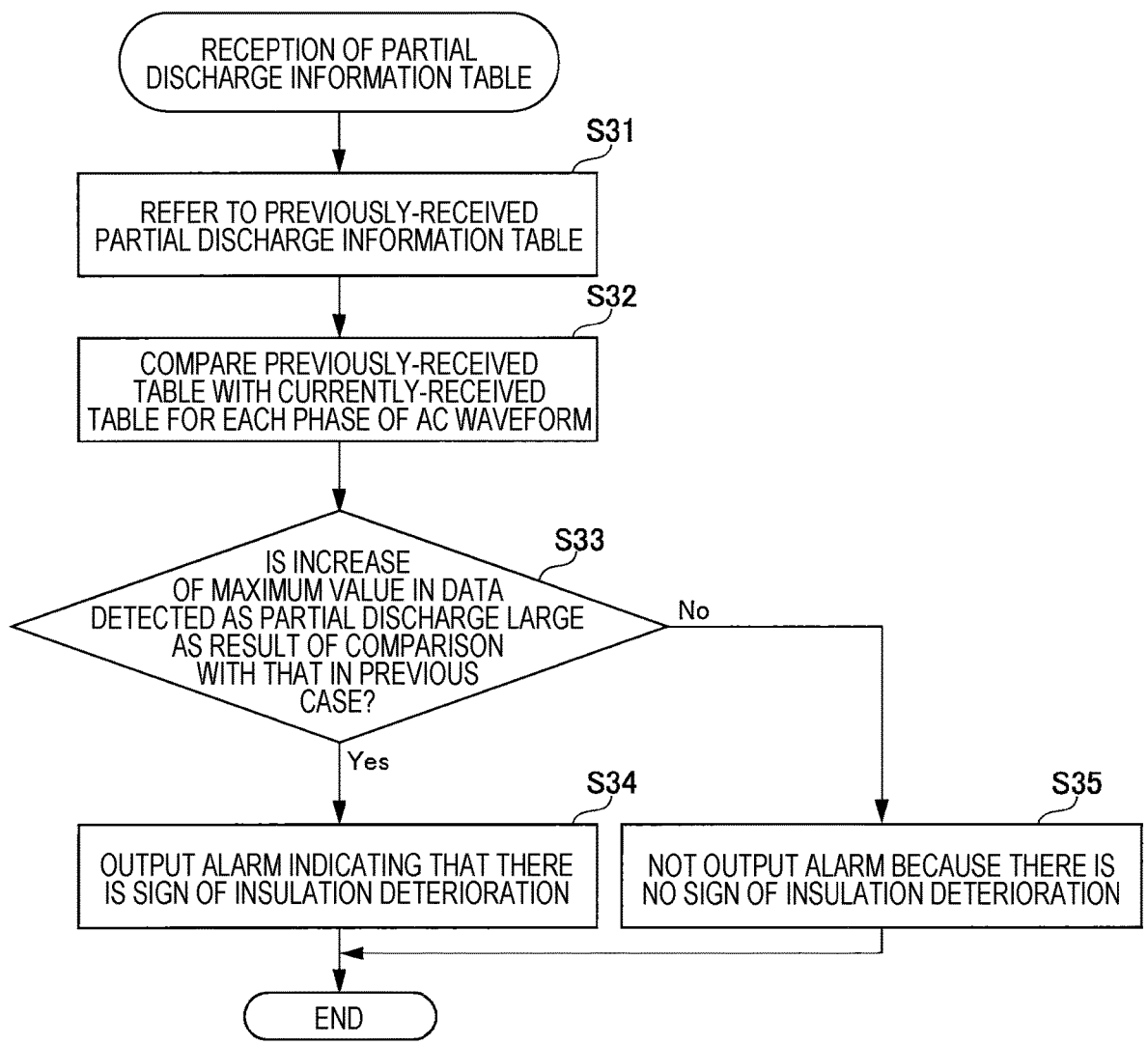
FIG. 11 is a flowchart illustrating an example of processing in which a higher measuring device determines whether or not an insulation of a power cable is deteriorated, according to the first embodiment of the present invention.

FIG. 11 is a flowchart illustrating an example of processing in which the higher measuring device 60 determines whether or not the insulation of the power cable is deteriorated.

Firstly, the higher measuring device 60 receives the partial discharge information table 1305, as illustrated at the top of FIG. 11 (that is, at the start). That is, all the pieces of data in the partial discharge information table 1305 transmitted from the communication unit 1400 are received by the higher measuring device 60.

Then, the higher measuring device 60 refers to the partial discharge information table 1305 received previously (S31). Then, the higher measuring device 60 compares the data of the previously-received table with the data of the currently-received table for each phase of the AC waveform (S32).

Then, the higher measuring device 60 determines whether the increase of the maximum value of the data detected as the partial discharge is larger than that in the previous case (S33). In a case where the higher measuring device 60 determines that the increase of the maximum value of the data detected as the partial discharge is larger than that in the previous case (Yes in S33), the higher measuring device outputs an alarm indicating that "there is a sign of the insulation deterioration" (S34), and then ends the processing.

On the other hand, in a case where the higher measuring device 60 determines that the increase of the maximum value of the data detected as the partial discharge is not larger than that in the previous case (No in S33), the higher measuring device does not issue the alarm as "no sign of insulation deterioration" (S35), and then ends the processing.

In this manner, in a case where the higher measuring device 60 determines that there is a sign of the insulation deterioration, the higher measuring device can output the alarm to inform the sign of the insulation deterioration.

In the partial discharge detection apparatus 1000 according to the first embodiment described above, in order to prevent the frequency component of the partial discharge pulse from being at the boundaries of the first, second, third, and n-th Nyquist frequency bands, two types (180 MHz and 200 MHz) of the sampling frequencies are provided for the high-speed AD converter 1210. Further, the switching of the sampling frequency is performed at the timing of each cycle of the commercial frequency.

Therefore, for a wideband partial discharge pulse, the high-speed AD converter 1210 observes the partial discharge pulse under the condition of not satisfying the sampling theorem, and switches the frequency between the two types of sampling frequencies at the timing of the commercial frequency. Then, the high-speed AD converter 1210 digitizes the analog signal input from the high-frequency analog input circuit 1200. The magnitude determination unit 1306 determines the magnitude of the data by comparing the sample data of the partial discharge, which is input from the high-frequency analog input circuit 1200, with the read data in the partial discharge information table 1305, and updates the partial discharge information table 1305 with the larger data. Therefore, the partial discharge information table 1305 allows the partial-discharge-detection digital signal processing unit 1300 to detect the presence or absence of a partial discharge pulse under the condition of not satisfying the sampling theorem. As described above, in the partial discharge detection apparatus 1000 according to the present embodiment, even though the frequency band of a partial discharge pulse overlaps a Nyquist boundary of an analog signal of a partial discharge current sampled at a certain sampling frequency, it is possible to detect the partial discharge pulse at a location different from a Nyquist boundary of an analog signal sampled at another sampling frequency.

In addition, the higher measuring device 60 compares the previously-received partial discharge information table 1305 with the currently-received partial discharge information table 1305 for each phase of the AC waveform, and determines whether the increase of the maximum value of the data detected as the partial discharge is larger than that in the previous case. If the increase of the maximum value of the data is large, the alarm indicating that "there is a sign of the insulation deterioration" can be issued.

Further, in the above-described embodiment, the sampling frequency of the high-speed AD converter 1210 is set to 180 MHz or 200 MHz, but sampling may be performed at a different sampling frequency other than 180 MHz and 200 MHz. Even in this case, it is desirable that the value of the least common multiple of the values of 1/2 of the two sampling frequencies be larger than the frequency band of the partial discharge.

Second Embodiment

Next, a configuration example of a partial discharge detection apparatus according to a second embodiment of the present invention will be described with reference to FIGS. 12 to 15.

Figure 12:
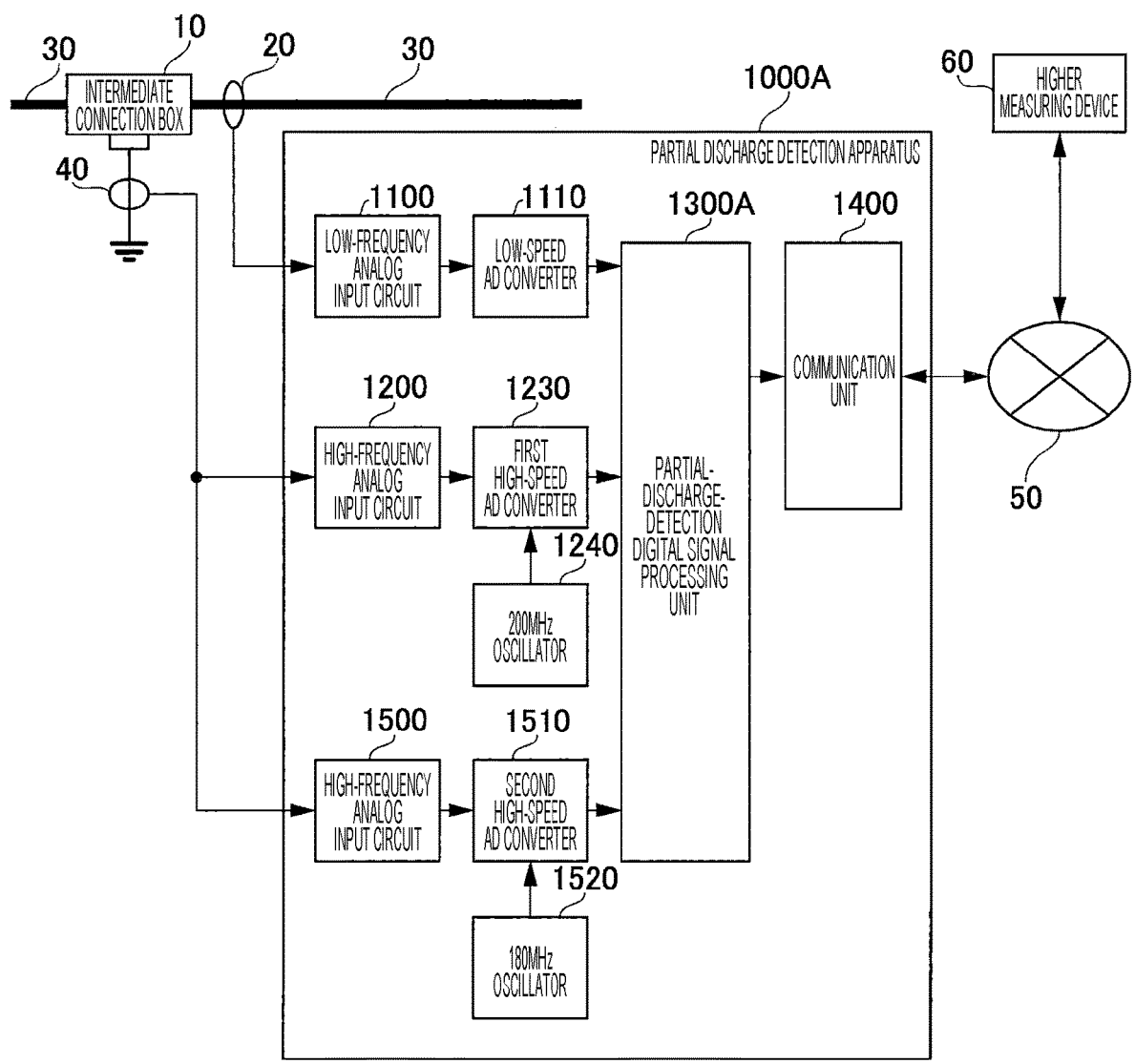
FIG. 12 is a schematic block diagram illustrating an example of a configuration of a partial discharge detection system 1 configured using a partial discharge detection apparatus according to a second embodiment of the present invention.

FIG. 12 is a schematic block diagram illustrating an example of a configuration of a partial discharge detection system 1A configured using a partial discharge detection apparatus 1000A according to the second embodiment of the present invention.

In the partial discharge detection apparatus 1000A forming the partial discharge detection system 1A according to the second embodiment, two high-frequency analog input circuits 1200 and 1500 are connected to the current transformer 40. The same analog signal (analog value) is input from the current transformer 40 to the high-frequency analog input circuits 1200 and 1500.

The analog signal from the high-frequency analog input circuit 1200 is input to a first high-speed AD converter 1230. The first high-speed AD converter 1230 digitizes the analog signal input from the high-frequency analog input circuit 1200 at a sampling frequency of 200 MHz based on the 200 MHz sampling clock input from a 200 MHz oscillator 1240. Then, the digital signal of the AC waveform, which is obtained by digitization at the sampling frequency of 200 MHz is input to a partial-discharge-detection digital signal processing unit 1300A. The digital signal input to the digital signal processing unit 1300A by the first high-speed AD converter 1230 is also referred to as "first sample data of partial discharge".

Further, the analog signal from the high-frequency analog input circuit 1500 is input to a second high-speed AD converter 1510. The second high-speed AD converter 1510 digitizes the analog signal input from the high-frequency analog input circuit 1500 at a sampling frequency of 180 MHz based on the 180 MHz sampling clock input from a 180 MHz oscillator 1520. Then, the digital signal of the AC waveform, which is obtained by digitization at the sampling frequency of 180 MHz is input to the partial-discharge-detection digital signal processing unit 1300A. The digital signal input to the digital signal processing unit 1300A by the second high-speed AD converter 1510 is also referred to as "second sample data of partial discharge".

The partial-discharge-detection digital signal processing unit 1300A performs digital signal processing for detecting the partial discharge, based on a digital signal of the AC waveform having a commercial frequency, which is input from the low-speed AD converter 1110, and a digital signal of a partial discharge current input from each of the first high-speed AD converter 1230 and the second high-speed AD converter 1510. Therefore, in the partial discharge detection apparatus 1000A according to the present embodiment, the sampling frequency switcher 1220 provided in the partial discharge detection apparatus 1000 according to the first embodiment is not required.

<Configuration Example of Partial-Discharge-Detection Digital Signal Processing Unit>

Figure 13:
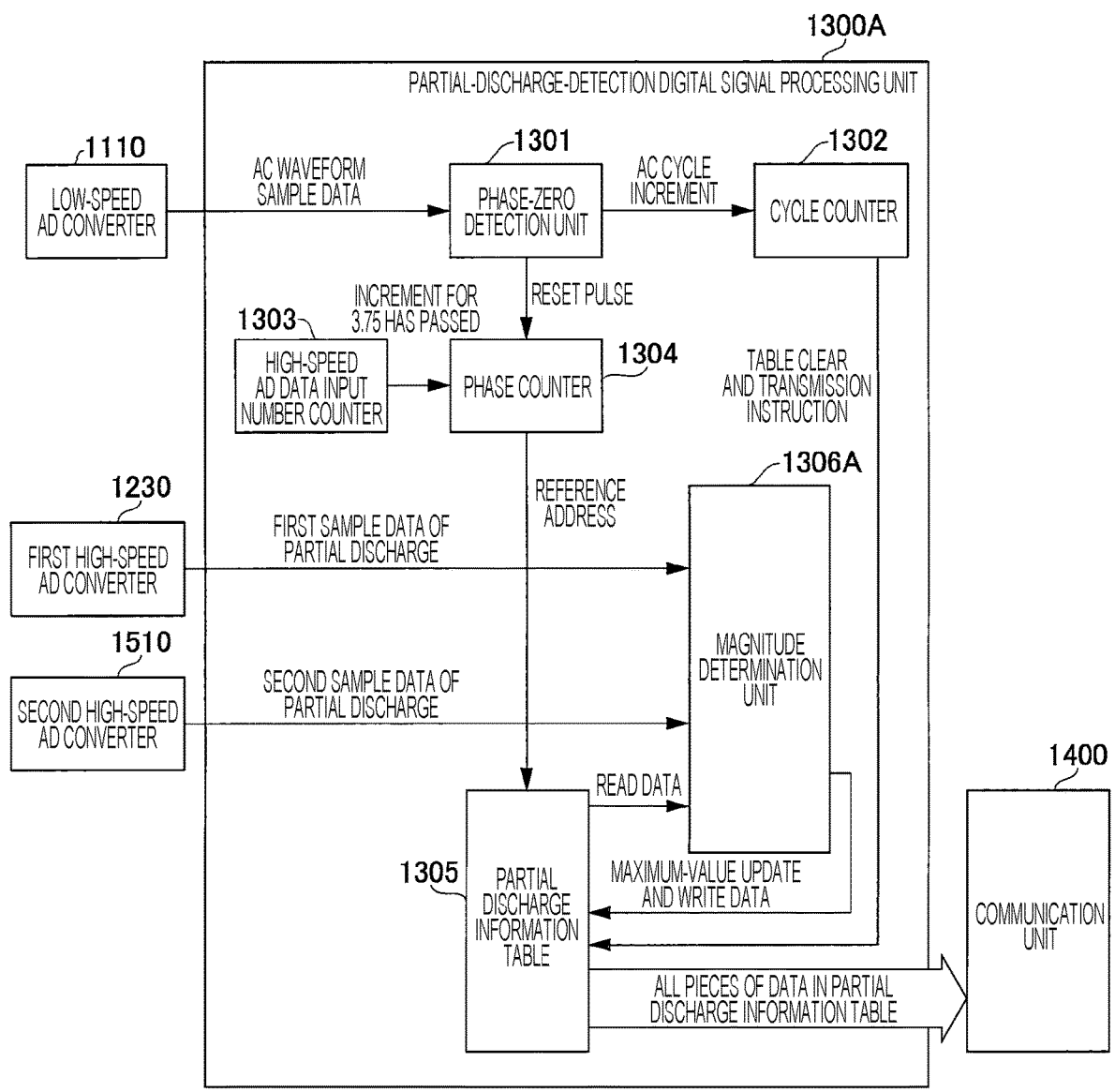
FIG. 13 is a block diagram illustrating a detailed configuration example of a partial-discharge-detection digital signal processing unit of the partial discharge detection apparatus according to the second embodiment of the present invention.

FIG. 13 is a block diagram illustrating a detailed configuration example of the partial-discharge-detection digital signal processing unit 1300A of the partial discharge detection apparatus 1000.

The partial-discharge-detection digital signal processing unit 1300A has the same configuration as the partial-discharge-detection digital signal processing unit 1300 according to the first embodiment, but data input to a magnitude determination unit 1306A is different. Specifically, the first sample data of partial discharge is input from the first high-speed AD converter 1230 to the magnitude determination unit 1306A, and the second sample data of the partial discharge is input from the second high-speed AD converter 1510 to the magnitude determination unit 1306A.

Then, the magnitude determination unit 1306A performs the magnitude determination of which one of a value obtained by superposing the first sample data and the second sample data of the partial discharge and the maximum value read from the partial discharge information table 1305 is larger. In a case where the value obtained by superposing the first sample data and the second sample data of the partial discharge is larger than the maximum value read from the partial discharge information table 1305, the magnitude determination unit 1306A updates the data of the partial discharge information table 1305.

Figure 14:
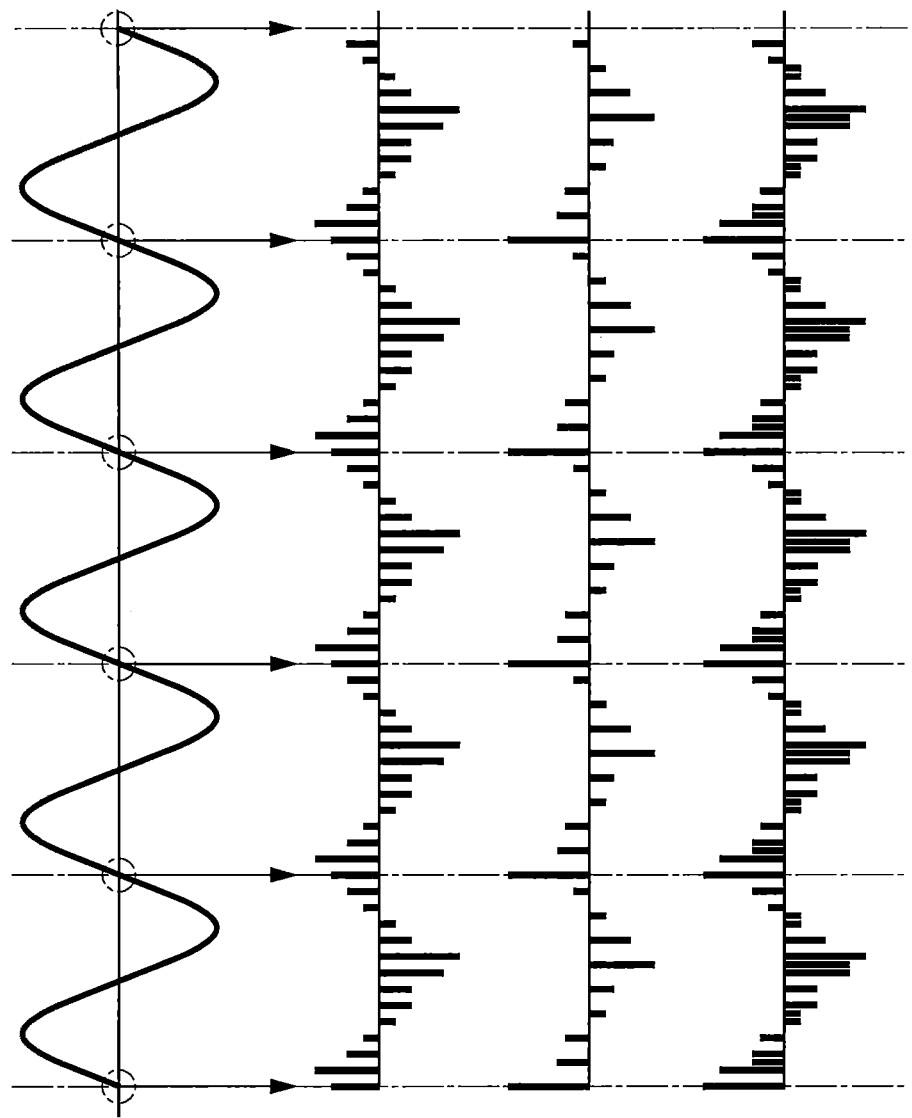
FIG. 14 is an explanatory diagram illustrating an example of sampling data of a first high-speed AD converter and a second high-speed AD converter according to the second embodiment of the present invention.

FIG. 14 is an explanatory diagram illustrating an example of the sampling data of the first high-speed AD converter 1230 and the second high-speed AD converter 1510.

The waveform diagram (1) of FIG. 14 represents an example of an AC waveform having a commercial frequency. The commercial frequency is, for example, 50 Hz or 60 Hz.

The sampling data (2) in FIG. 14 represents the sampling data of the partial discharge pulse sampled at the sampling frequency of 200 MHz by the first high-speed AD converter 1230. At this time, the first high-speed AD converter 1230 performs processing of converting an analog signal into a digital signal at the first sampling frequency (200 MHz).

The sampling data (3) in FIG. 14 represents the sampling data of the partial discharge pulse sampled at a sampling frequency of 180 MHz by the second high-speed AD converter 1510. At this time, the second high-speed AD converter 1510 performs processing of converting an analog signal into a digital signal at the second sampling frequency (180 MHz).

The sampling data (4) in FIG. 14 represents the sampling data of 200 MHz and the sampling data of 180 MHz which are superposed. The processing of converting an analog signal into a digital signal by the first high-speed AD converter 1230 and the second high-speed AD converter 1510 is performed at the same phase interval obtained by dividing one cycle of the AC waveform.

As described above, by superposing the sampling data of 200 MHz and the sampling data of 180 MHz, the magnitude determination unit 1306A can obtain the maximum value of the sampling data for each phase of the AC waveform of the commercial frequency.

Figure 15:
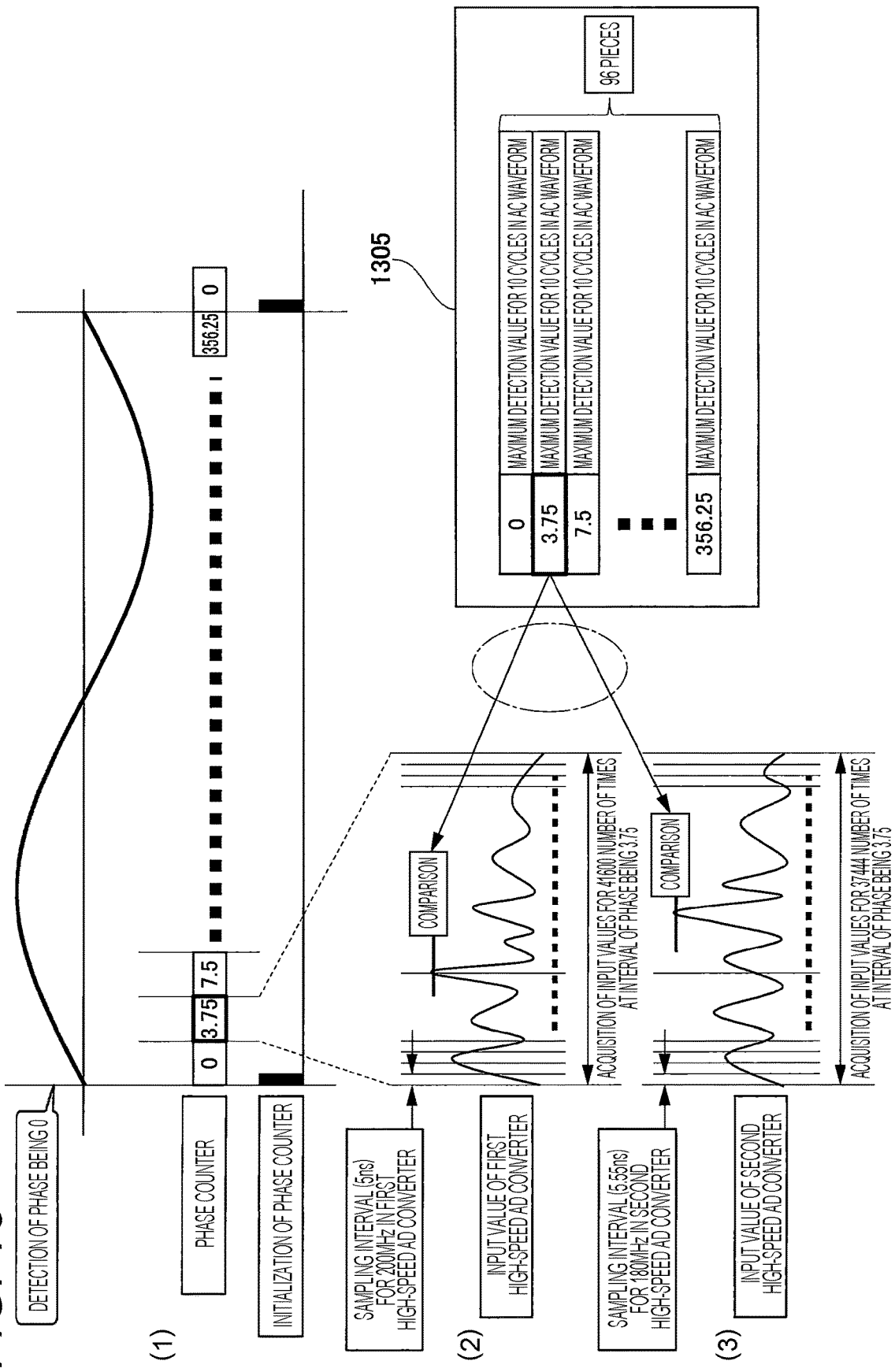
FIG. 15 is an explanatory diagram illustrating a form in which a magnitude determination unit detects the partial discharge in one cycle of the AC waveform, according to the second embodiment of the present invention.

FIG. 15 is an explanatory diagram illustrating a form in which the magnitude determination unit 1306A detects the partial discharge in one cycle of the AC waveform.

As described above, the values (input values) of the sampling data of 200 MHz and the sampling data of 180 MHz are compared with the maximum detection value of the AC waveform for 10 cycles, which is acquired from the partial discharge information table 1305, for each of the phases (0, 3.75, 7.5, . . . , 356.25) of the phase counter 1304. Then, in a case of the maximum value (maximum detection value in the partial discharge information table 1305)<input value, the magnitude determination unit 1306A updates the maximum value (maximum detection value) of the partial discharge information table 1305 with the input value.

The maximum value updated in each phase in one cycle of the AC waveform is read from the partial discharge information table 1305 and transmitted to the higher measuring device 60 via the communication unit 1400. Then, the higher measuring device 60 compares the data in the partial discharge information table 1305, which is received from the communication unit 1400 of the partial discharge detection apparatus 1000 with the data obtained by referring to the partial discharge information table 1305, which has been previously received. In a case where the higher measuring device 60 determines that the increase of the maximum value of the data detected as the partial discharge is larger than that in the previous case, the higher measuring device can output an alarm indicating that "there is a sign of the insulation deterioration".

The partial discharge detection apparatus 1000A according to the second embodiment described above includes the first high-speed AD converter 1230 and the second high-speed AD converter 1510, and thus it is possible to digitize an analog signal at two different types of sampling frequencies at the same phase interval of the AC waveform. Then, the magnitude determination unit 1306A determines the magnitude of the data by comparing the two types of sample data with the read data in the partial discharge information table 1305. Thus, the partial-discharge-detection digital signal processing unit 1300 can reliably check the presence or absence of the partial discharge pulse.

MODIFICATION EXAMPLES

In each of the above-described embodiments, an example in which the specific phase interval of the AC waveform 1310 is set to a section which is obtained by division into 96 and has a phase of 3.75°, and further the predetermined cycle of the AC waveform 1310 for extracting the maximum value of the charge amount is set to 10 cycles is described. However, the number of divisions of the specific phase interval of the AC waveform and the number of cycles of the AC waveform for extracting the maximum value of the charge amount are not limited to this example, and may have other values.

Then, a configuration may be made with a computer program or the like that can be controlled so that the setting can be freely changed by using the number of divisions of the phase interval and the number of cycles of the AC waveform as parameters.

Further, the number of cycles of the AC waveform for extracting the maximum value of the charge amount may be set to, for example, one cycle in a case of only the first Nyquist region and (n×2) cycles in a case of checking the first to n-th Nyquist regions, in accordance with the range of the Nyquist frequency domain for detecting the partial discharge.

In each of the above-described embodiments, the processing of obtaining the charge amount of the partial discharge from the partial discharge pulse signal 1320 illustrated in FIGS. 2 and 8 is performed in all sections (for example, all sections obtained by division into 96) of the specific phase interval of the AC waveform 1310.

On the other hand, the partial discharge digital signal processing units 1300 and 1300A can also perform the processing of obtaining the charge amount of the partial discharge for some sections of the specific phase interval of the AC waveform. By obtaining the charge amount of the partial discharge for some sections, it is possible to reduce the amount of data in advance rather than obtaining the charge amount of the partial discharge for all the sections.

However, in a case where the partial discharge digital signal processing units 1300 and 1300A obtain the charge amount of the partial discharge for some sections, when the partial discharge occurs in a section where the processing of obtaining the charge amount of the partial discharge is not performed, it is not possible to detect the occurred partial discharge. Accordingly, a section for performing the processing of obtaining the charge amount of the partial discharge is selected in accordance with the actual frequency of the partial discharge.

The frequency of the partial discharge is high near the zero cross of the AC waveform of 50 Hz or 60 Hz (the zero point where the sign of the current amount changes, the point where the phase is 0°, 180°, and 360°), and the partial discharge is distributed before and after the zero cross. Thus, for example, sections of a predetermined number (for example, 50 pieces or 70 pieces) having a higher frequency of the partial discharge before and after the zero cross may be selected among 96 sections obtained by division into 96 as described above, and the charge amount of the partial discharge may be obtained for the selected section.

As described above, even in a case where the partial discharge digital signal processing units 1300, 1300A obtain the charge amount of the partial discharge for some sections of the specific phase interval of the AC waveform, the phase of the AC waveform is obtained from the digital signal of the AC waveform, and the AC waveform is divided into the specific phase intervals by using the obtained phase of the AC waveform.

Further, in each of the above-described embodiments and modification examples, the charge amount of the partial discharge is obtained for all or some of the sections of the specific phase interval of the AC waveform, and the maximum value of the charge amount is extracted every predetermined number of cycles. In this manner, the amount of the signal is reduced.

The method of processing of reducing the amount of the partial discharge digital signal is not limited to the methods of the above-described embodiments and modification examples, and other methods can also be adopted. Even in a case where when other methods are adopted, the phase of the AC waveform is obtained from the digital signal of the AC waveform, and the processing of reducing the amount of the partial discharge digital signal is performed using the obtained phase of the AC waveform. Thus, it is possible to cause the partial discharge digital signal to correspond to the phase of the AC waveform. Thus, it is possible to reduce the amount of the partial discharge digital signal while the partial discharge that is likely to occur near the zero cross being a specific phase is more reliably detected.

Note that it should be noted that the present invention is not limited to the above-described embodiments, and it goes without saying that various other application examples and modification examples can be taken as long as the gist of the present invention described in the claims is not deviated.

For example, the above-described embodiments describe the configurations of the apparatus and the system in detail and concretely in order to explain the present invention in an easy-to-understand manner, and are not necessarily limited to those including all the described configurations. In addition, it is possible to replace a part of the configuration of the embodiment described here with the configuration of another embodiment, and further, it is possible to add the configuration of another embodiment to the configuration of one embodiment. Regarding some components in the embodiments, other components can also be added, deleted, and replaced.

Control lines and information lines considered necessary for the descriptions are illustrated, and not all the control lines and the information lines in the product are necessarily shown. In practice, it may be considered that almost all components are connected to each other.

In the above-described embodiments, the configuration example in which the Rogowski coil 20 is installed on the power cable 30 to detect a current signal and acquire voltage phase information has been described. Since it is necessary to consider workability and safety when measuring voltage phase information, a case where an AC voltage signal is taken from a commercial power supply that has been voltage-converted via a transformer into a power cable system for partial discharge detection, and the AC voltage signal is acquired as the voltage phase information can be realized.

Note that the phase shift occurs in the AC voltage signal of the commercial power supply and the AC voltage signal of the cable system due to the passage of the transformer, but such phase shift can be corrected by calculation.

REFERENCE SIGNS LIST

1 partial discharge detection system
40 current transformer
60 higher measuring device
1000 partial discharge detection apparatus
1100 low-frequency analog input circuit
1110 low-speed AD converter
1200 high-frequency analog input circuit
1210 high-speed AD converter
1220 sampling frequency switcher
1300 digital signal processing unit
1301 phase-zero detection unit
1302 cycle counter
1303 high-speed AD data input number counter
1304 phase counter
1305 partial discharge information table
1306 magnitude determination unit
1400 communication unit

The invention claimed is:

1. A partial discharge detection apparatus for detecting partial discharge in a power cable and recognizing an insulation deterioration state of the power cable, the apparatus comprising:
   a first converter that converts an analog signal having an AC waveform flowing through the power cable into a digital signal;
   a second converter that converts an analog signal of a partial discharge current into a digital signal, the analog signal being in a plurality of first Nyquist frequency domains of a first sampling frequency and in a plurality of second Nyquist frequency domains of a second sampling frequency, each of the first Nyquist frequency domains having a bandwidth interval of half of the first sampling frequency and each of the second Nyquist frequency domain having a bandwidth interval of half the second sampling frequency; and
   a signal processing unit that detects the partial discharge based on a maximum value or a sum of a current value, which is obtained from the digital signal of the partial discharge current converted by the second converter, for each phase of the AC waveform obtained from the digital signal having the AC waveform flowing through the power cable, the digital signal being obtained by the conversion of the first converter.

2. The partial discharge detection apparatus according to claim 1,
   wherein
   the first sampling frequency and the second sampling frequency are set such that a value of thoa least common multiple of a value being half of the first sampling frequency and a value being half of the second sampling frequency is greater than a frequency band of the partial discharge.

3. The partial discharge detection apparatus according to claim 2,
   wherein the signal processing unit includes a table in which data of the digital signal obtained by the conversion of the second converter at the first sampling frequency and data of the digital signal obtained by the conversion at the second sampling frequency are recorded at predetermined phase intervals obtained by dividing one cycle of the AC waveform, and wherein a magnitude determination unit that performs magnitude determination by comparing the data recorded in the table with the data of the digital signal obtained by the conversion of the second converter at each of a same phase intervals, and updates the data recorded in the table with the data of the digital signal, which is larger than the data recorded in the table.

4. The partial discharge detection apparatus according to claim 3, wherein the second converter performs alternate switching between processing of converting the analog signal into the digital signal at the first sampling frequency and processing of converting the analog signal into the digital signal at the second sampling frequency, for each predetermined cycle of the AC waveform.

5. The partial discharge detection apparatus according to claim 3, wherein the second converter performs processing of converting the analog signal into the digital signal at the first sampling frequency and processing of converting the analog signal into the digital signal at the second sampling frequency, for each of the same phase intervals.

6. The partial discharge detection apparatus according to claim 3, further comprising:

a communication unit that outputs the data recorded in the table to a higher measuring device that is connected to an external network and monitors the partial discharge.

7. A partial discharge detection method for detecting partial discharge in a power cable and recognizing an insulation deterioration state of the power cable, the method comprising:

converting an analog signal having an AC waveform flowing through the power cable into a digital signal;

converting an analog signal of a partial discharge current into a digital signal, the analog signal being in a plurality of first Nyquist frequency domains of a first sampling frequency and in a plurality of second Nyquist frequency domains of a second sampling frequency, each of the first Nyquist frequency domains having a bandwidth interval of half of the first sampling frequency and each of the second Nyquist frequency domain having a bandwidth interval of half the second sampling frequency; and detecting the partial discharge based on a maximum value or a sum of a current value obtained from the digital signal of the partial discharge current, for each phase of the AC waveform obtained from the digital signal having the AC waveform flowing through the power cable.

* * * * *